United States Patent [19]
Linn et al.

[11] Patent Number: 5,849,627
[45] Date of Patent: *Dec. 15, 1998

[54] BONDED WAFER PROCESSING WITH OXIDATIVE BONDING

[75] Inventors: Jack H. Linn; Robert K. Lowry, both of Melbourne; George V. Rouse, Indialantic, all of Fla.; James F. Buller, Austin, Tex.

[73] Assignee: Harris Corporation, Melbourne, Fla.

[ * ] Notice: The term of this patent shall not extend beyond the expiration date of Pat. No. 5,387,555.

[21] Appl. No.: 430,312

[22] Filed: Apr. 28, 1995

Related U.S. Application Data

[63] Continuation of Ser. No. 42,340, Apr. 2, 1993, abandoned, which is a continuation-in-part of Ser. No. 834,439, Feb. 12, 1992, Pat. No. 5,266,135, which is a continuation of Ser. No. 781,686, Oct. 24, 1991, abandoned, which is a continuation of Ser. No. 476,322, Feb. 7, 1990, abandoned, Ser. No. 939,786, Sep. 3, 1992, Pat. No. 5,387,555, and Ser. No. 921,197, Jul. 28, 1992, Pat. No. 5,362,667.

[51] Int. Cl.⁶ ................................................. H01L 21/30
[52] U.S. Cl. .................. 438/455; 438/406; 148/DIG. 12
[58] Field of Search ............................. 437/62, 86, 925, 437/974; 148/DIG. 12, DIG. 135; 438/406, 455, 458, 459

[56] References Cited

U.S. PATENT DOCUMENTS

| 5,098,861 | 3/1992 | Blackstone | 437/200 |
|---|---|---|---|
| 5,102,821 | 4/1992 | Moslehi | 437/62 |
| 5,168,078 | 12/1992 | Reisman et al. | 437/195 |
| 5,183,769 | 2/1993 | Rutter et al. | |
| 5,266,135 | 11/1993 | Sholt et al. | 156/87 |
| 5,362,667 | 11/1994 | Linn et al. | 437/62 |
| 5,387,555 | 2/1995 | Linn et al. | 437/225 |

FOREIGN PATENT DOCUMENTS

| 0 238 066 | 9/1987 | European Pat. Off. . |
|---|---|---|
| 0 256 397 | 2/1988 | European Pat. Off. . |
| 0 441 270 A3 | 8/1991 | European Pat. Off. . |
| 2 242 313 | 9/1991 | United Kingdom . |

OTHER PUBLICATIONS

Shimbo, M., "Silicon–to–Silicon direct bonding method", J. Appl. Phys., 60(8), 15 Oct. 1986, pp. 2987–2989.

Wolf, et al., Silicon Processing, vol. 1, Lattice Press, 1986, pp. 265–266, 390–391.

Toshiba KK, *Bonding Method for Semiconductor Wafer*, Patent Abstracts, vol. 9, No. 227 E–355), A 60121715, Jun. 11, 1985, Japan.

Fukuroda et al., *Si Wafer Bonding with Ta Silicide Formation*, Japanese Journal of Applied Physics, vol. 30, No. 10A, pp. 1693–1695, Oct. 1, 1991, Tokyo, Japan.

Muller and Stoffel, *Tensile Strength Characterization of Low–Temperature Fusion–Bonded Silicon Wafers*, Journal of Micromechanics & Microengineering, vol. 1, No. 3, pp. 161–166, 1991, New York.

(List continued on next page.)

*Primary Examiner*—T. N. Quach
*Attorney, Agent, or Firm*—Jaeckle Fleischmann & Mugel, LLP

[57] ABSTRACT

Low temperature wafer bonding using a chemically reacting material between wafers to form a bonded zone to bond two wafers together. Examples include silicon wafers with a silicon-oxidizing bonding liquid which also permits introduction of radiation hardening dopants and electrically active dopants as constituents of the bonding liquid. Silicon wafers also may use solid reactants which include deposited layers of metal and polysilicon to form silicide bonded zones. Oxidizers such as nitric acid may be used in the bonding liquid, and a bonding liquid may be used in conjunction with a solid bonding reactant. Dielectric layers on silicon wafers may be used when additional silicon is provided for the bonding reactions. Integrated circuits fabricated from such bonded wafers may have buried layers and radiation hardening and buried resistors.

5 Claims, 16 Drawing Sheets

OTHER PUBLICATIONS

Astrova et al., *The Nature of the P–Type Layer formed in the Interface Region of Semiconducting Wafers During Solid–Phase Direct Bonding of Silicon*, A. F. Ioffe Physicotechnical Institute, Russian Academy of Sciences, pp. 457–458, Jul. 18, 1992, New York.

Imthurn et al., *Bonded Silicon–On–Sapphire Wafers and Devices*, Journal of Applied Physics, vol. 72, No. 6, pp. 2526–2527, Sep. 15, 1992, New York.

Godbey et al., *Fabrication of Bond and Etch–Back Silicon On Insulator Using Strained $Si_{0.7}Ge_{0.3}$ Layer as an Etch Stop*, Journal of Electrochemical Society, vol. 137, No. 10, pp. 3219–3223, Oct. 1990, New Hamshire.

J. Lasky et al., *Silicon–On Insulator (SOI) by Bonding and Etch–Back*, 1985 IEDM Tech., Dig. 85, 684–687.

Spierings and Haisma, *Diversity and Interfacial Phenomena in Direct Bonding*, pp. 18–32: An Overview, Proceedings First International Symposium on Semiconductor Wafer Bonding, Electrochemical Society Meeting, Phoenix, Arizonia, Oct., 1991.

Maszara, *Semiconductor Wafer Bonding: An Overview*; Proceedings of First International Symposium on Semiconductor Wafer Bonding, Science, Technology & Applications; Electrochemical Society Meeting, Phoenix, Arizonia, Oct. 1991, pp. 3–17.

BONDED WAFER PROCESSING WITH OXIDATIVE BONDING

CROSS REFERENCE TO RELATED APPLICATIONS

This application is a continuation of application Ser. No. 08/042,340, filed Apr. 2, 1993 abandoned, which is a continuation-in-part of applications Ser. No. 07/834,439 filed Feb. 12, 1992 and now U.S. Pat. No. 5,266,135 which was a continuation of 07/781,686 filed Oct. 24, 1991, abandoned, which is a continuation of 07/476,322, filed Feb. 7, 1990, abandoned; and filed Sep. 3, 1992 U.S. Pat No. 5,387,555 and 07/921,197, filed Jul. 28, 1992 now U.S. Pat. No. 5,362,667 07/939,786. These cross-referenced applications are assigned to the assignee of this application.

BACKGROUND AND SUMMARY OF THE INVENTION

The present invention relates to electronic integrated circuits and methods of fabrication, and, more particularly, to dielectrically isolated semiconductor integrated circuits and related fabrication methods.

Silicon-on-insulator substrates

Integrated circuits fabricated in silicon-on-insulator substrates offer performance advantages including freedom from latchup for CMOS structures, high packing density, low parasitic capacitance, low power consumption, radiation hardness, high voltage operation, and the possibility of three dimensional integration. Indeed, isolation trenches extending through the silicon layer down to the insulation provide a simple approach to dielectric isolation of integrated circuit devices. The sidewalls of such trenches are coated with an insulator, usually silicon dioxide ("oxide"), and the remaining portion of the trench opening, if any, is filled with a filer which is usually polycrystalline silicon ("polysilicon" or simply "poly"). Diffused PN junctions can also be used for lateral isolation.

Additionally, silicon-on-insulator technology using very thin films offers special advantages for submicron devices. Scaling bulk devices tends to degrade their characteristics because of small-geometry effects, such as punch-through, threshold voltage shift, and subthreshold-slope degradation. The use of silicon-on-insulator devices suppresses these small-geometry effects. Therefore, even in the submicron VLSI era, silicon-on-insulator technology can offer even higher device performance than can bulk technology, along with the inherent advantages of silicon-on-insulator.

Silicon-on-insulator substrates may be fabricated in various ways: a crystalline silicon layer may be formed over an existing oxide layer either by laser or strip heater recrystallization of polysilicon deposited on the oxide or by selective epitaxial silicon growth over the oxide. However, the quality of such a silicon layer is generally inferior to that normally associated with bulk silicon. Other approaches form an oxide layer beneath an existing high quality silicon layer either by oxidizing a buried porous silicon layer or by oxygen ion implantation; however, such oxide is low quality and the silicon top layer may be damaged during the oxide layer formation.

A different approach to silicon-on-insulator is direct wafer bonding as described by J. Lasky et al., Silicon-On-Insulator (SOI) by Bonding and Etch-Back, 1985 IEDM Tech. Deg. 684. This wafer bonding process proceeds as follows: a lightly doped epitaxial layer of silicon is grown on a heavily doped silicon substrate, oxide is thermally grown on the epilayer, a second lightly doped silicon substrate is thermally oxidized, the two oxidized surfaces are pressed together. See FIG. 1a. The pressed together wafers are inserted into an oxidizing atmosphere at 1,100° C. to bond them as illustrated in FIG. 1b. Lastly, a preferential etch is used to remove the heavily doped substrate, leaving the thin, lightly doped epitaxially layer above the bonded thermally grown oxides which are now on the second substrate as shown in FIG. 1c. The resulting thin silicon layer above the thermally grown oxide has high quality and the oxide also retains its quality and may be thick, as might be desired for CMOS or high voltage devices, or thin, as might be desired for shared element applications. FIG. 1d heuristically illustrates trench isolation with polysilicon-filled trenches isolating MOSFET and bipolar devices.

Conceptually, this wafer bonding process may meet all the desired goals for the ultimate silicon-on-insulator material: a specular-finished crystalline silicon layer without dislocations plus a back interface with the insulator of quality equal to the interface of thermally grown silicon dioxide on silicon, and both the crystalline silicon layer and the insulator of variable thickness.

Dissimilar wafer bonding

Analogous to the direct wafer bonding of Lasky et al which effectively has two glass (oxide) surfaces fusing at high temperature, various dissimilar materials may be directly bonded as described in:

Spierings and Haisma, Diversity and Interfacial Phenomena in Direct Bonding, . . . Maszara, Semiconductor Wafer Bonding: An Overview, Proc. First Int. Symp. Semi. Wafer Bonding, Electrochem. Soc. Meeting, Phoenix, Ariz. October 1991.

The first article investigates bonding a wide variety of materials to fused quartz (oxide) by contact pressure; hydroxyl groups on the quartz surface apparently aid the bonding. The first and second articles both note direct bonding of various pairs of materials such as GaAs to Si, InP to $LiNbO_3$, and n-type Si to p-type Si. The theory presumes van der Waals and electrostatic forces adhere two surfaces at which time chemical bonds among atoms in the top one or two atomic layers may form. In particular, hydrogen bonds may transform into covalent bonds during heating.

Analogously, Malhi, U.S. Pat. No. 4,875,086 bonds two silicon wafers by applying a thick (12 $\mu$m) slurry of low temperature glass particles (e.g., PbO, $SiO_2$, and $Al_2O_3$) between the two wafers, drying, and then firing at 900° C. to fuse the glass particles and thereby bond the two wafers. This would also appear to be an atomic surface layer bonding between the glass and the polysilicon or oxide wafer surfaces.

Another silicon-silicon wafer bonding method, illustrated in FIGS. 2a–c and described in copending U.S. patent application Ser. No. 834,439, filed Feb. 12, 1992, proceeds as follows. Start with a device wafer having a lightly doped epilayer on a heavily doped substrate and a handle wafer with a thick (4,000 A) oxide layer. Activate the surface of the device wafer with an acid or peroxide wash to enhance hydroxyl group formation. Place a drop of oxidant such as water plus hydrogen peroxide on the oxide, and squeeze the wafers together. See FIG. 2a. The drop of oxidant has a volume in the range of 0.8 to 8.0 microliters per square inch of wafer surface. Dry the squeezed wafers at room temperature for a day and then heat the squeezed wafers to 1150° C. degrees C for two hours. The heating drives an oxidation of the device wafer and the silicon-oxygen bonds formed fuse the two wafers. See FIG. 2b. Lastly, grind and etch the device wafer until exposure of the device epilayer. This completes the silicon-on-insulator substrate as shown in FIG. 2c. For applications requiring a thick (10–60 µm) silicon-on-insulator layer and a thicker (e.g., 4 µm) bottom oxide, but allowing some tolerance in the layer thickness, a slightly simpler process could be used. A uniformly lightly doped device wafer could be used, and the thinning process could be just grinding and polishing.

However, these known direct wafer bonding methods rely on the intrinsic behavior of the material surfaces and bonds forming between the top atomic layers or a thermal oxidation of silicon, and thus are limited in the types of interfaces and bond strengths obtainable and processing temperatures.

Features

The present invention provides bonded wafer processing with the features of (1) relatively low temperature bonding by the use of low temperature, chemical reactants which react with the surface layer material of at least one of the wafers to form a bonded zone of a new material which binds the wafers, (2) availability of bonding nonsilicon wafer materials, and (3) incorporation of dopants at the bonded zone. The reactants may be introduced in either liquid or solid form or both. In preferred embodiments the bonded zone of new material may be on the order of 500 Å to 1000 Å thick.

BRIEF DESCRIPTION OF THE DRAWINGS

The present invention will be described with reference to the accompanying drawings, which are schematic for clarity.

DESCRIPTION OF THE PREFERRED EMBODIMENTS

Silicon with nitrogen

Figure 1A:
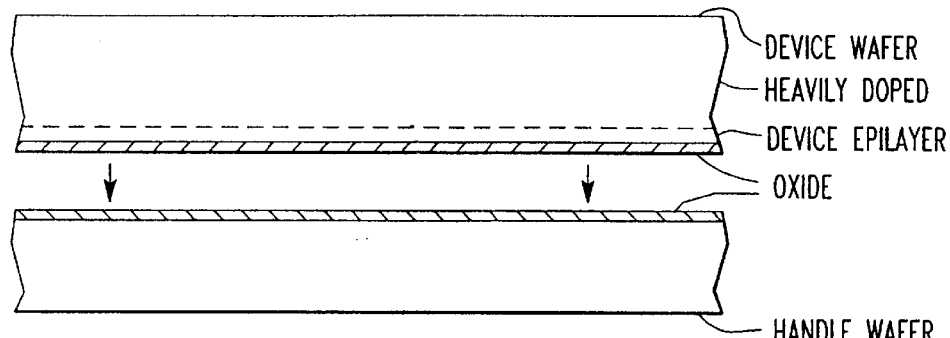
FIGS. 1a–1d illustrate in cross sectional elevation views known wafer bonding methods and integrated circuits.
Figure 1B:
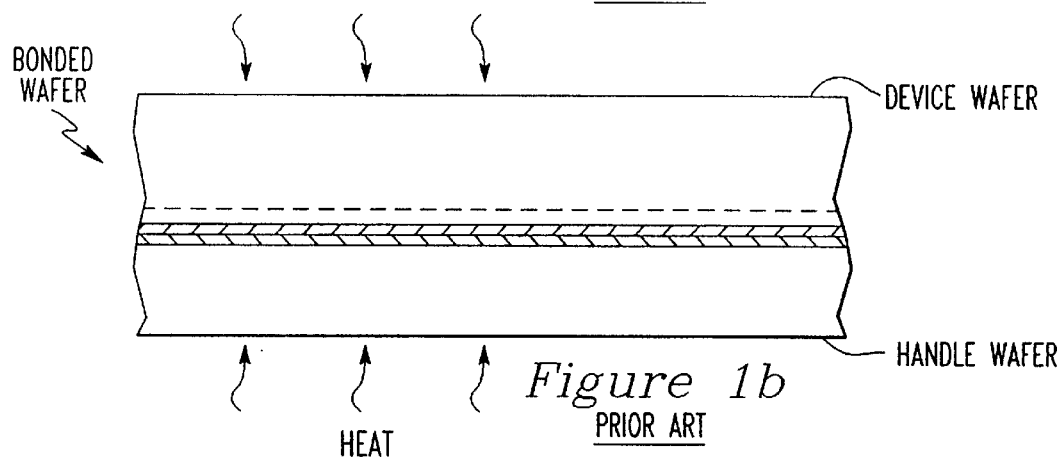
Figure 1C:
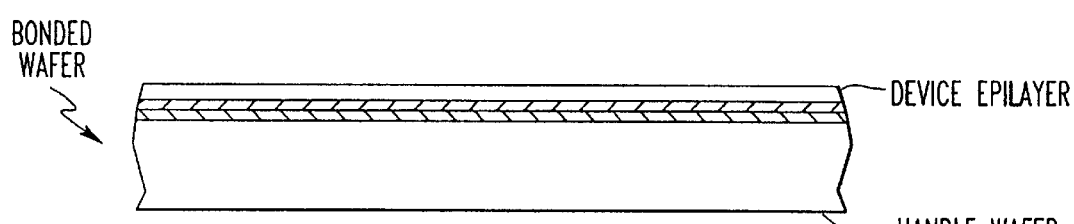
Figure 1D:
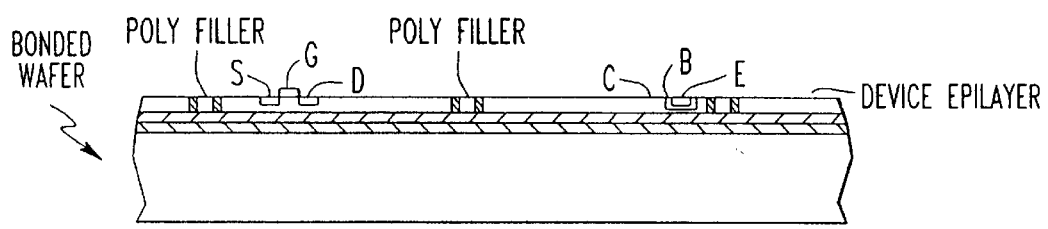

FIGS. 3a–e illustrate in cross sectional elevation view a first preferred embodiment method of bonded wafer processing.

(a) Begin with a four inch diameter 500 µm thick silicon device wafer 302 and a comparable diameter 500 µm thick silicon handle wafer 312. Device wafer 302 has the doping type and resistivity (e.g., N type and 20 ohm-cm resistivity) desired for eventual device fabrication and has only native oxide on its surfaces. Thermally oxidize handle wafer 312 to form oxide layers 314 and 316. Oxide 316 will become the bottom oxide, so the oxide is grown to the desired bottom oxide thickness; for example, 4 µm. Oxide 314 provides stress compensation to restrain warpage. Place drop 305 of oxidizing aqueous solution of $HNO_3$ and $H_2O_2$ on oxide 316; see FIG. 3a. Drop 305 is 20% by volume a 67% $HNO_3$ solution and 80% by volume a 30% $H_2O_2$ solution. Other mixtures also work. Drop 305 has a volume of about 0.05 cc which implies 4.0 microliters per square inch of wafer surface and theoretically will spread out to a layer with thickness (if uniform) of 6 µm on oxide 316. Note that drop 305 wets the surface of oxide 316. (Drop volume in the range of 4 to 10 microliters per square inch of wafer surface provides good bonding.) A buried layer in the final device structures will be formed as part of the bonding process, so device wafer 302 does not require an implant.

(b) Press handle wafer 312 and device wafer 302 together with drop 305 of first preferred embodiment oxidizer on the surface of oxide 316. Let the pressed together wafers dry for 24 hours and then heat them to 800°–1000° C. in a 2–6 hour furnace cycle with an oxidizing ambient. This low temperature bonding does not depend entirely on oxidation as in the process of FIGS. 2a–c, but is coupled with an oxidation reduction reaction of nitrate oxdizing the silicon of wafer 302 coupled with slow thermal oxidation. See FIG. 3b. The nitrate forms both silicon-oxygen and silicon-nitrogen bonds, and the water primarily evaporates. The reactions (unbalanced) basically are:

$$Si+2HNO_3+H_2O_2 Si_nO_xN_y+H_2O+H_2+3O_2+NO_2$$

This creates bonded zone 315 of a mixture of silicon oxynitrides ("nitrox") connecting the remainder of device wafer 302 to oxide 316 and handle wafer 312. Bonded zone nitrox 315 has a thickness of roughly 500–800 Å and average values of x and y of roughly 0.8 and 0.2, respectively. FIG. 3h shows a SIMS (secondary ion mass spectrometry) profile of the bonded wafer structure with nitrox apparent between the oxide lefthand portion of FIG. 3h) and the silicon (center and righthand portion). FIG. 3i shows for comparison a SIMS profile of a bonded wafer made by the process of FIGS. 2a–c and with nitrogen implanted to the oxide-silicon interface. The nitrox in FIG. 3h is confined to a 500–800 Å to thick bonded zone and avoids the long nitrogen tails due to implantation straggle apparent in FIG. 3i. Of course, increasing the ratio of $HNO_3$ to $H_2O_2$ will decrease x and increase y and somewhat increase the thickness of bonded zone nitrox 315; and conversely for a decrease in the ratio.

(c) After bonding, remove the bulk of device wafer 302 by grinding, lapping, and polishing to leave the desired device island thickness; for example, 35–40 µm. This thinning of device wafer 302 proceeds without any etchstop, so the final thickness of device wafer 302 depends upon process control. See FIG. 3c. The use of an etchstop permits much smaller device island thicknesses, such as 1 µm.

(d) Thermally grow mask oxide 326 on device wafer 302 to a thickness of about 4 µm, this increases backside oxide 314 on handle wafer 312 to about 4.5 µm but will not affect bond nitrox layer 315 or bottom oxide layer 316. Mask oxide 326 will be used as a trench etch mask. See FIG. 3d.

(e) Print a trench pattern into photoresist spun onto mask oxide 326. Note that the bottom oxide 316 (4 μm), the mask oxide 326 (4 μm) and the backside oxide 314 (4.5 μm) are all fairly closely matched in thickness during the photoresist patterning, and bond nitrox layer 315 is fairly thin. This provides a rough stress balance and limits warpage of the bonded wafers. Use the patterned photoresist as etch mask to wet etch (HF) the trench pattern in oxide 326. The wet etch removes 4 μm from backside oxide 314 to leave only 0.5 μm. Then strip the photoresist and use the patterned oxide 326 to plasma reactive ion etch (RIE) device wafer 302 to form silicon islands 322, 323, . . . on bond nitrox layer 315. See FIG. 3e.

Figure 3A:
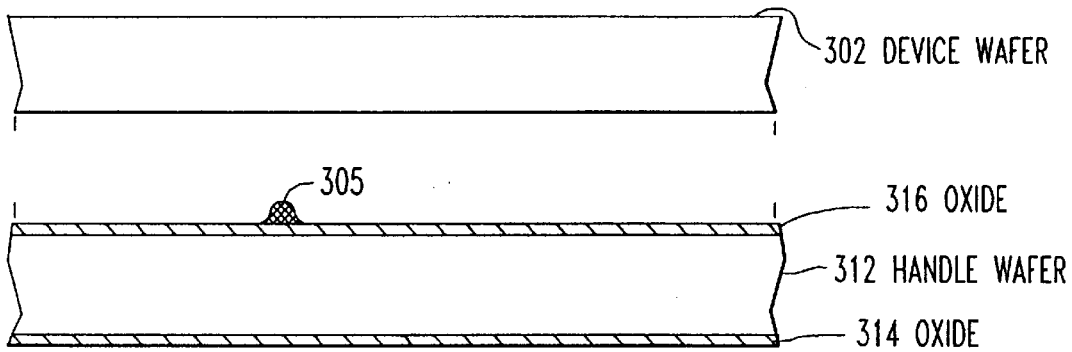
FIGS. 3a–3i are cross sectional elevation views and analysis of a first preferred embodiment method of wafer bonding.
Figure 3B:
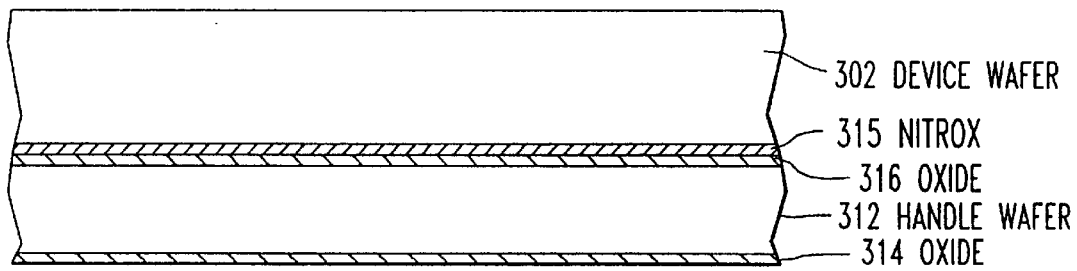
Figure 3C:
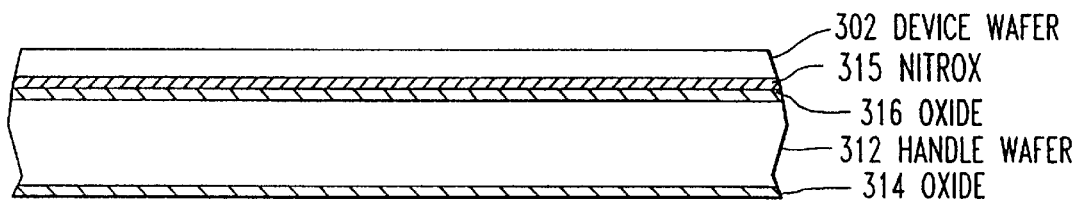
Figure 3D:
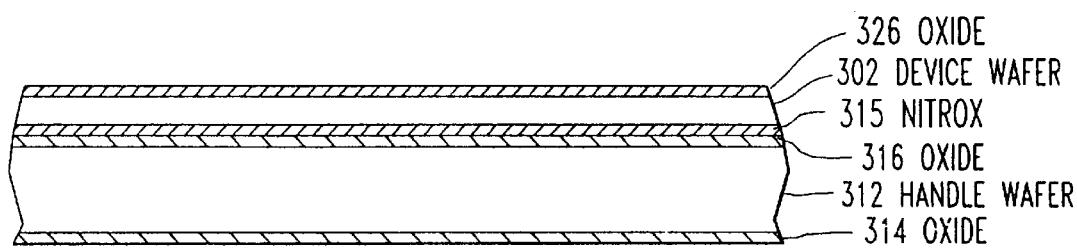
Figure 3E:
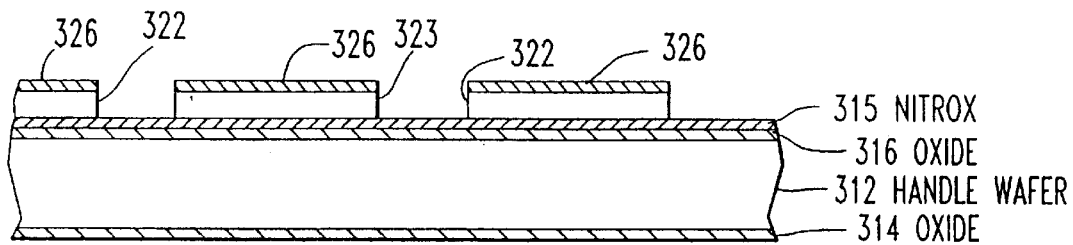
Figure 3F:
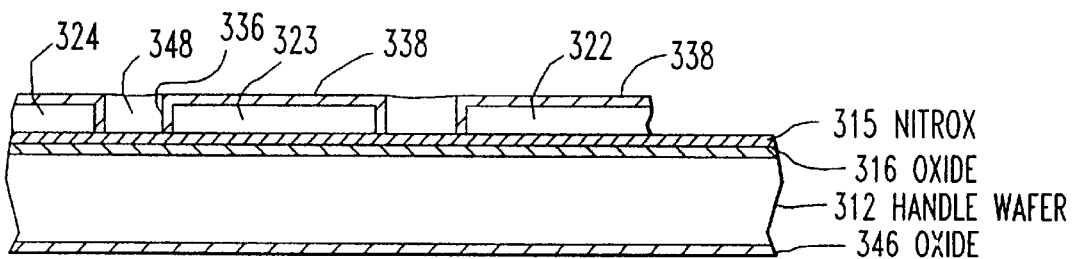

(f) Strip patterned oxide 326 with a wet etch. This etch also removes the remaining backside oxide 314 on the back of handle wafer 312. Then thermally grow oxide to a thickness of 4 μm to form isolation oxide 336 on the sides of islands 322, 323, . . . This also forms 4 μm of oxide 338 on the island surfaces and 4 μm of backside oxide 346 on handle wafer 312. Next, deposit polysilicon 348 to fill the trenches. Lastly, planarize to remove the polysilicon except from the trenches. See FIG. 3f. Note that again the island surface oxide 338, bottom oxide 316, and backside oxide 346 all have about the same thickness (4 μm ).

Figure 3G:
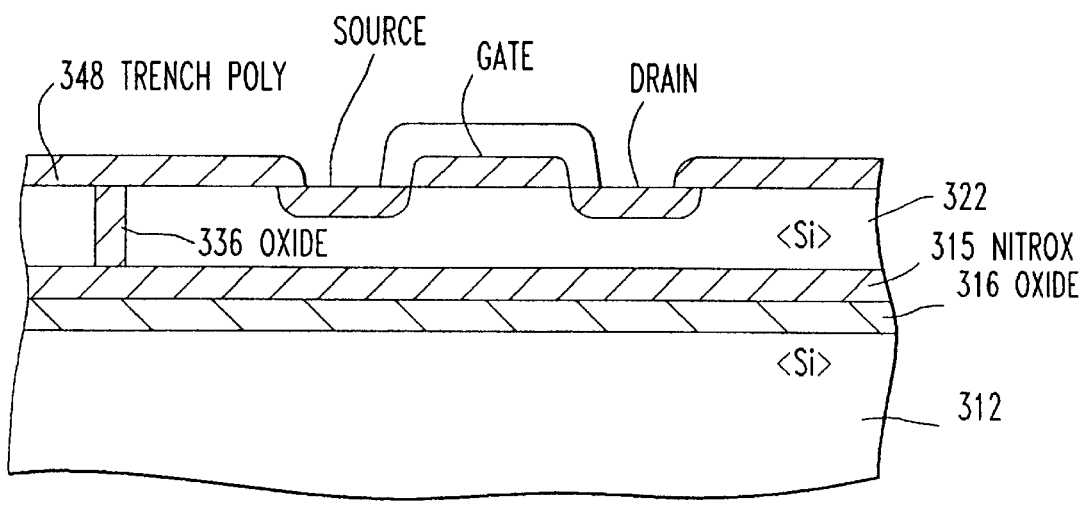

(g) Fabricate devices in islands 322, 323, . . with repeated cylces of (1) thermally grow oxide layer, (2) spin on photoresist using a spinner vacuum chuck, (3) pattern the photoresist using an aligner vacuum chuck, (4) wet etch the oxide using the patterned photoresist as etch mask, (5) and diffuse or implant or etch silicon using the patterned oxide as diffusion/implant/etch mask. FIG. 3g illustrates in magnified view a partially completed MOSFET in island 322 which would be just in an integrated circuit fabricated on the bonded wafer.

An advantage of silicon-on-insulator integrated circuits with devices overlying bond nitrox layer 315 rather than just bottom oxide layer 316 lies in their radiation hardness. Radiation affects a typical silicon-on-oxide structure by generating positive charges at the silicon-oxide interface. These positive charges will shift a MOSFET threshold due to the body effect. However, nitrogen as a nitrox compound in nitrox layer 315 will neutralize positive charges at the interface.

Also, nitrox layer 315 has a higher dielectric constant than bottom oxide layer 316. In fact, the dielectric constant of nitride is about 7.9 and that of oxide is about 3.9.

Figure 2A:
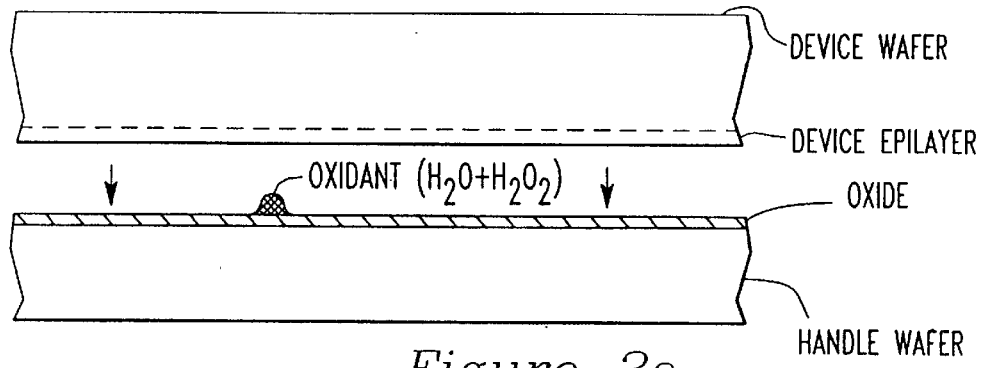
FIGS. 2a–2c illustrate in cross sectional elevation views a copending wafer bonding method.
Figure 2B:
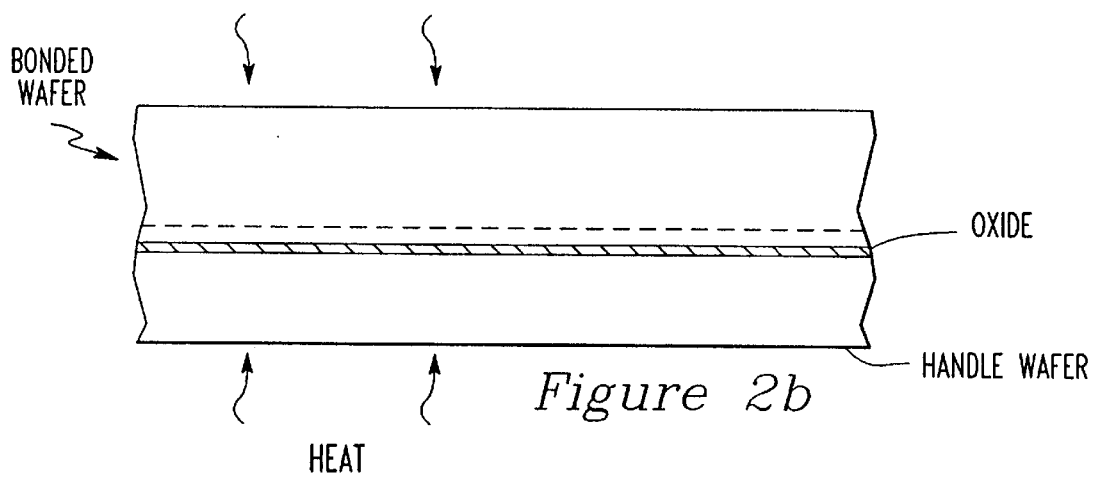
Figure 2C:
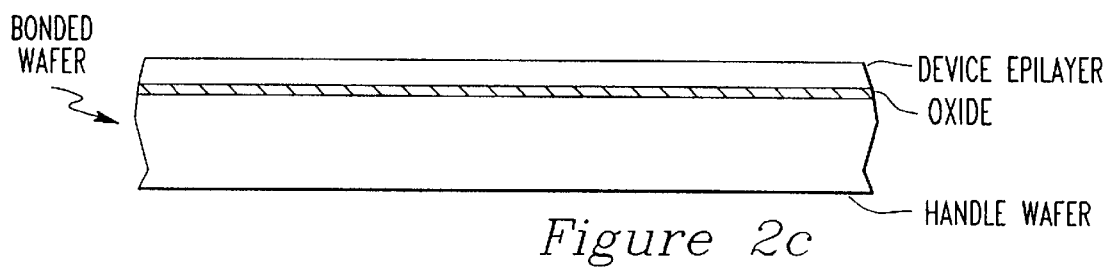
Figure 3H:
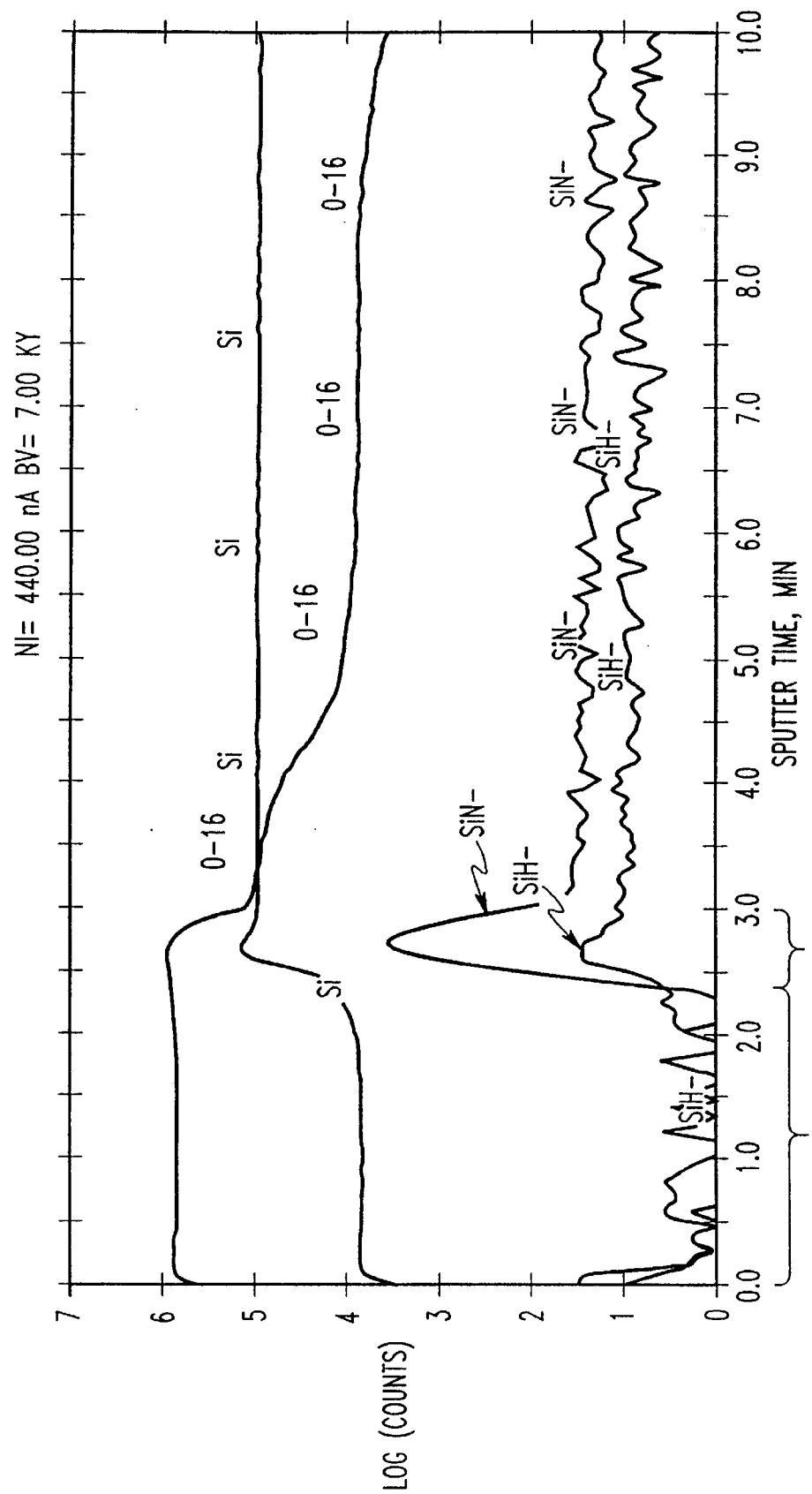
Figure 3I:
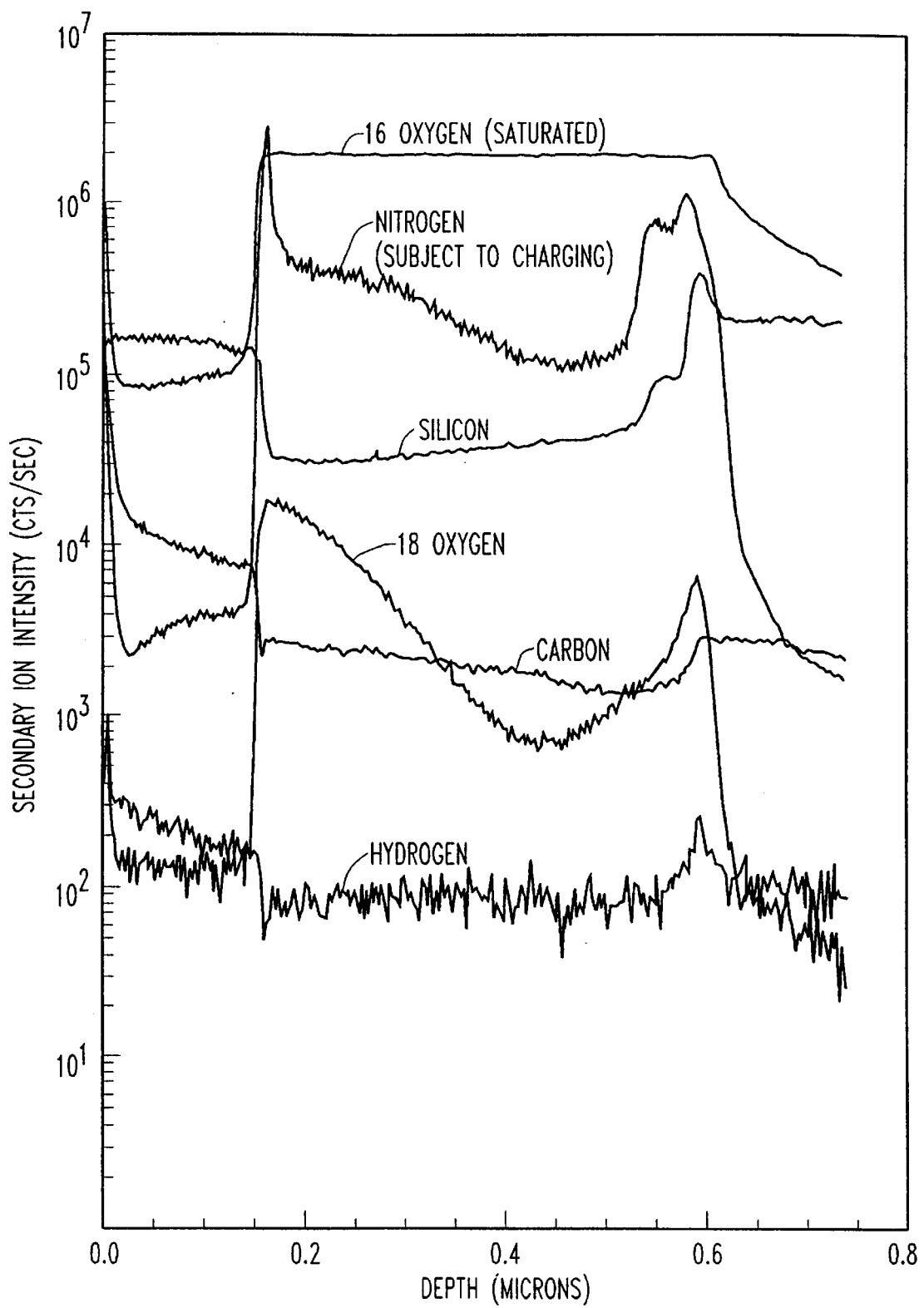

Experimental bonding temperatures of 850° C. and 1000° C. appear to yield bonded wafers with as good a bond as those bonded at 1150° C., which is the bonding temperature in the method of FIGS. 2a–c.

Silicon with other oxidizers

The second preferred embodiment method of bonded wafer processing follows the steps of the first preferred embodiment method but augments or replaces the oxidizer of drop 305 by a silicon oxidizer such as aqueous $HClO_4$. For example, the drop could be 50% $HNO_3$, 20% $HClO_4$ and 30% $H_2O_2$, or 100% $HClO_4$. The same relatively low temperature bonding occurs, and the chlorine ends up bonded in the silicon interface nitrox or oxide layer. The chlorine provides an additional neutralizer for positive charge generated at the silicon interface due to radiation. In this sense, perchlorate is similar to nitrate in that it both oxidizes silicon and provides positive charge neutralization. Of course, other oxidizers of silicon such as $CrO_3$, $H_2Cr_2O_7$, . . . can be used for the relatively low temperature bonding. These oxidizers will leave Cr, . . . in the silicon interface bonded layer, and electronegative ones will aid radiation hardness by neutralizing positive charges.

Silicon with electronegative dopants

The third preferred embodiment method follows the steps of the first preferred embodiment method, but augments the oxidizer of drop 305 with radiation hardening dopants such as F, S, P, . . . which will remain (at least in part) at the silicon interface during bonding. That is, in addition to $HNO_3$ for relatively low temperature bonding, drop 305 contains dopants such as HF, $H_2S$, $POCl_3$, . . . which will generate electronegative dopants to neutralize radiation-generated positive charges as they arise. Thus oxidizers such as dichromate plus electronegative dopants could provide both the low temperature bonding plus radiation hardening. Alternatively, a high temperature bonding ($H_2O_2$ alone) with these dopants would provide a doped oxide bonded zone which included radiation hardening.

Silicon with buried layer dopants

Figure 4:
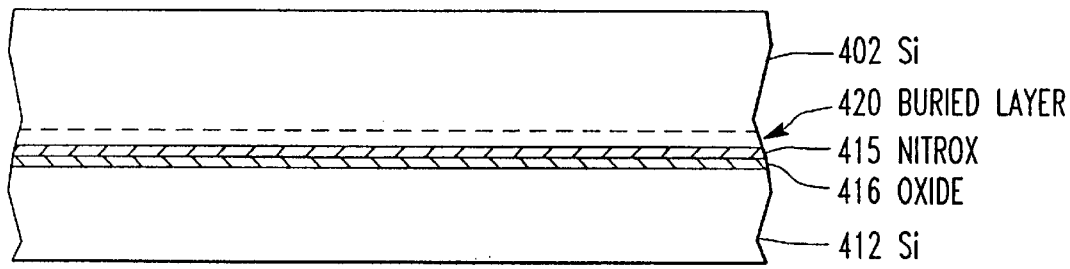
FIG. 4 shows a fourth preferred embodiment method in cross sectional elevation view.

The fourth preferred embodiment method follows the steps of the first preferred embodiment method, but augments the oxidizer of drop 305 with buried layer dopants such as As, P, B, Sb, . . . which will diffuse into the bottoms of silicon islands 322, 323, . . . during bonding and form buried layers. That is, in addition to $HNO_3$ for relatively low temperature bonding, drop 305 contains dopants such as $As_2O_3$, $POCl_3$, . . . which will generate the electrically active dopants such as As, P, B, Sb, in the device wafer during bonding. A portion of these dopants will diffuse to form buried layer 420 as illustrated in FIG. 4 with device wafer 402, handle wafer 412, bottom oxide 416, and bonded nitrox 415. The doping concentrations of the buried layers in the silicon depends upon the quantity of dopants initially introduced into drop 305. For example, if drop 305 were 1% dopant, then the drop would provide a dose on the order of $10^{18}$ dopant atoms per $cm^2$ of interface. Thus drop 305 can easily accomodate sufficient dopants even if only a small fraction of the dopants actually migrate out of the bonded zone during nitrox layer growth. Indeed, implantation of a buried layer typically uses an implant dose on the order of $10^{16}$ dopant atoms/$cm^2$. Recall that nitrox is a diffusion barrier for various dopants. Bonding at 1000° C. will help diffuse the dopants in the silicon and may be useful with thicker silicon islands.

Of course, a high temperature bonding (e.g., $H_2O_2$ alone) with these dopants would also yield buried layers, but the high bonding temperatures would diffuse the dopant much further into islands 322, 323, . . . and would not be useful for the case of very thin islands. For example, if islands 322, 323, . . . were only 1 μm thick, then a 2–6 hours bonding at 1150° C. would drive dopants throughout the islands.

Silicon with multiple layers

Figure 5A:
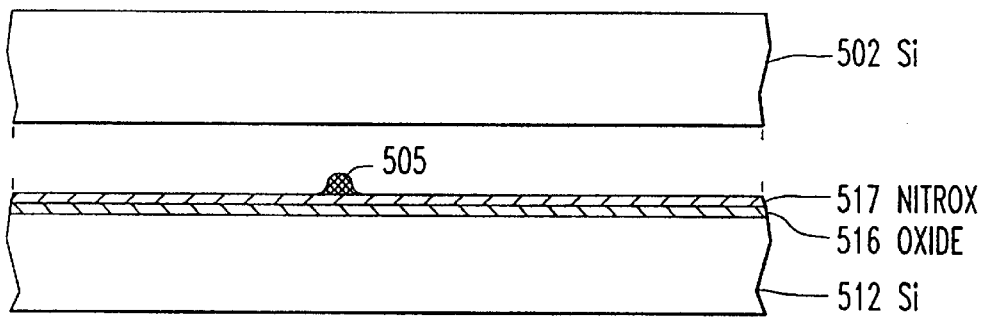
FIGS. 5a–5b are cross sectional elevation views of a variant of the first preferred embodiment.
Figure 5B:
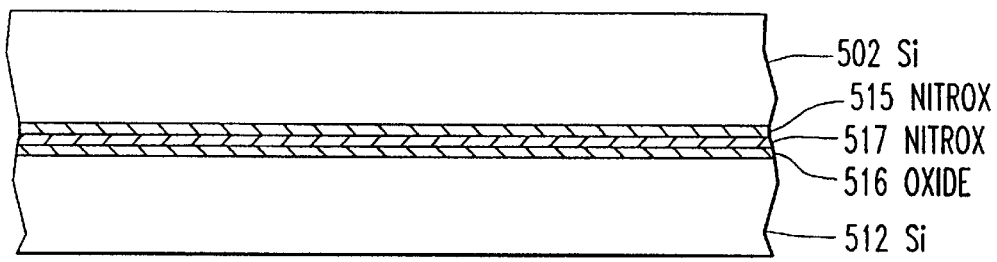

FIGS. 5a–b show modifications of the stating wafers for first preferred embodiment wafer bonding method. In particular, FIG. 5a has device wafer 502 again with only native oxides, but handle wafer 512 has both 4000 Å thick bottom thermal oxide 516 and 1000 Å thick deposited nitrox layer 517. Nitrox layer 517 has the composition $Si_wO_xN_y$ with x approximately equal to 0.6 and y approximately equal to 0.4 and may be formed by decomposition of silane with ammonia and oxygen. Drop 505 is a solution of $HNO_3$ to provide oxidation of wafer 502 and bonding at 800°–1000° C. The resulting bonded wafer illustrated in FIG. 5b includes bonded nitrox layer 515 of approximate thickness 500–800 Å and composition $Si_wO_xN_y$. The stack of bonded nitrox layer 515 on deposited nitrox layer 517 provides the advantages of (1) specifying the thickness and stoichiometry of buried nitrox 517 before deposition, (2) allowing a transition nitrox layer with different stoichiometry for matching stress and coefficients of thermal expansion, and (3) providing a barrier to contaminant diffusion if nitrox layer 517 is doped. Of course, dopants either for buried layers in device wafer 502 or for radiation hardening the bonded nitrox 515 or both could be included in the oxidizer drop 505.

Deposited nitrox 517 could be replaced with deposited and steam densified aluminum oxide (pseudo-sapphire) also of thickness about 1000 Å. The bonded wafers would then be separated by a stack of dielectrics: nitrox 515 on aluminum oxide 517 which is on thermal oxide 516. This inclusion of nitrox 515 on top of aluminum oxide 517 has the advantages of (1) increased radiation hardness of pseudo-sapphire layer, (2) the presence of a diffusion barrier (nitrox 515) to keep the aluminum in 517 from diffusing into the device silicon, and (3) a more closely matched thermal coefficient of expansion of nitrox 517 to the bonding nitrox layer and silicon device wafer than aluminum oxide 517.

Silicon with additional silicon for bonding

Figure 6:
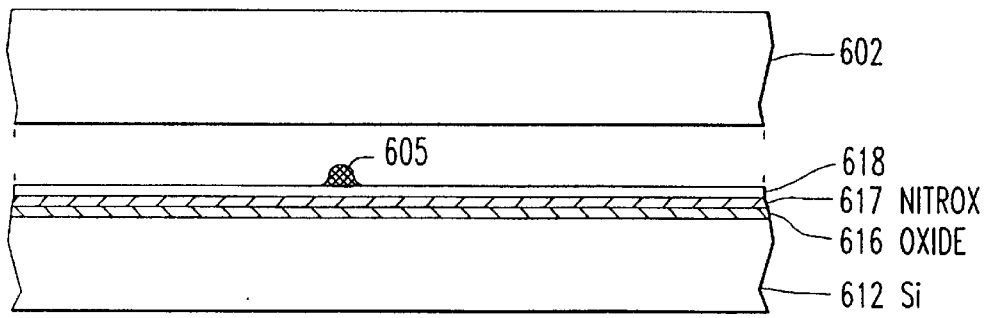
FIG. 6 illustrates a modification of the embodiment of FIGS. 5a–b.

FIG. 6 illustrates a variation of deposited nitrox/aluminum oxide layer 517 of FIG. 5a where additional silicon to aid the bonding has been included. In particular, handle wafer 612 has 4000 Å thick bottom oxide 616, 500 Å thick deposited nitrox or aluminum oxide 617, plus 300 Å thick polysilicon layer 618. Again, drop 605 contains an oxidizing solution such as $HNO_3$ plus $H_2O_2$. The bonding liquid oxidizes polysilicon 618 to nitrox in a manner similar to the oxidation of the surface portion of wafer 602. In effect, nitrox can form at both surfaces of the oxidizing liquid (drop 605 squeezed between the wafers). Drop 605 when uniformly spread over wafers 602 and 612 will form a layer about 6 μm thick and provide sufficient oxidizers to totally consume polysilicon layer 618 plus at least 300–500 Å of device wafer 602. The advantage of polysilicon layer 618 is that (1) it supplies a source of silicon for the bonding liquid to react with to form nitrox in the bonded zone without consuming substantial amounts of device wafer 602 (which might be doped), (2) it can be polished to provide a smooth surface for bonding if the underlying deposited dielectrics are rough, and (3) it can be thermally oxidized before bonding to provide a layer of silicon oxide between the deposited dielectric and the bonding nitrox and device wafer 602.

Silicon with dielectric layers on both wafers

Figure 7A:
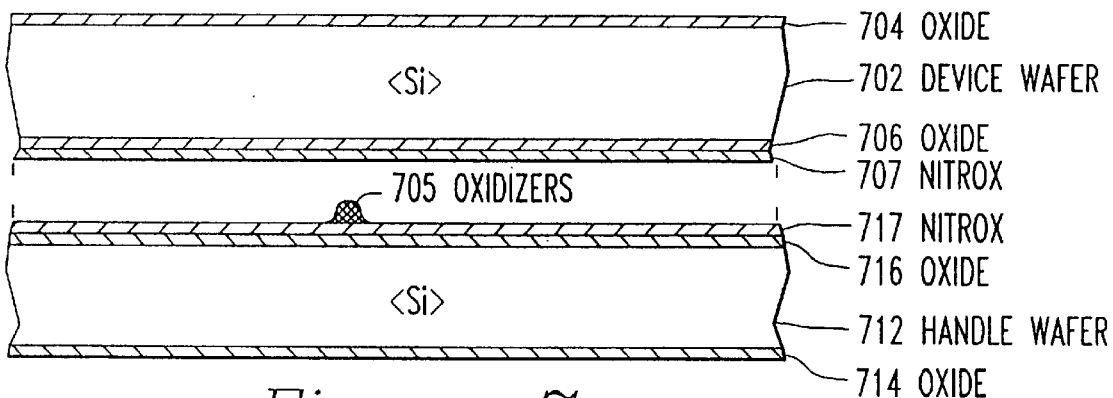
FIGS. 7a–7b show another preferred embodiment.
Figure 7B:
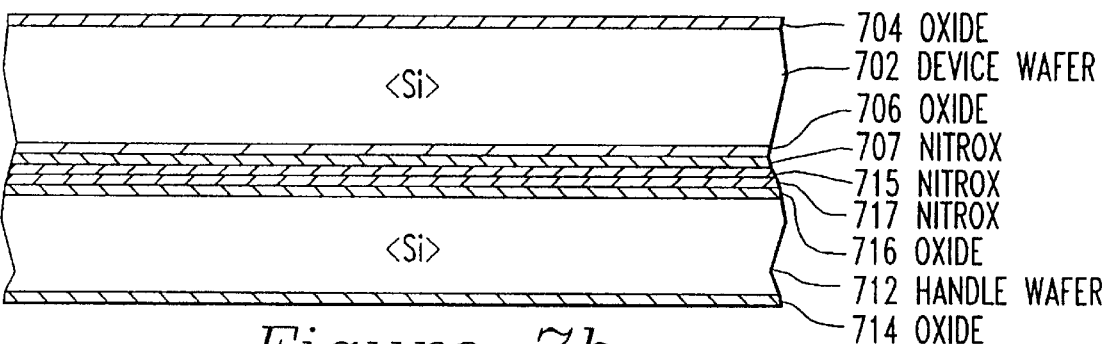

FIGS. 7a–b illustrate in cross sectional elevation views a fifth preferred embodiment wafer bonding method; this method employs dielectric layers on both wafers and supplies the silicon for bonding as part of the bond process as follows.

(a) Begin with 6-inch diameter 600 μm thick silicon device wafer 702 and 6-inch diameter 600 μm thick silicon handle wafer 712. Device wafer 702 has the doping type and resistivity desired for eventual device fabrication. Grow thermal oxides 704 and 706 on device wafer 702 and oxides 714 and 716 on handle wafer 712. Oxide 716 will become the bottom oxide, so the oxide is grown to the desired bottom oxide thickness; for example, 1 μm. Oxide 714 provides stress compensation to restrain warpage. Deposit 1000Å thick silane-rich nitrox layer 717 on oxide 716 and silane-rich nitrox layer 707 on oxide 706 by a decomposition of silane with ammonia and oxygen. Nitrox layers 717 and 707 have the composition $Si_wO_xN_y$ with x approximately equal to 0.6 and y approximately equal to 0.4 plus unreacted silane ($SiH_4$). (Unreacted silane in the nitrox can be detected by infrared spectroscopy). Place drop 705 of oxidizing aqueous solution of $HNO_3$ and $H_2O_2$ on nitrox 717; see FIG. 7a. Drop 705 is 50% by volume a 67% $HNO_3$ solution and 50% by volume a 30% $H_2O_2$ solution. Drop 705 has a volume of about 0.05 ml which implies 4.0 microliters per square inch of wafer surface and theoretically will spread out to a layer with thickness (if uniform) of 6 μm on nitrox 717. Note that drop 705 wets the surface of nitrox 717. (Drop volume in the range of 4 to 10 microliters per square inch of wafer surface provides good bonding.)

(b) Press handle wafer 712 and device wafer 702 together with drop 705 of oxidizer on the surface of nitrox 717. Let the pressed together wafers dry for 24 hours and then heat them to 800°–1000°° C. in a 2–6 hour furnace cycle with an oxidizing ambient. This low temperature bonding does not drive rapid thermal oxidation as in the process of FIGS. 2a–c, but relies upon the electrochemical action of nitrate oxidizing the silicon of silane-rich nitrox 707 and 717 coupled with slow thermal oxidation. See FIG. 7b. Even though nitride is an oxidation barrier for silicon, the unreacted silane can diffuse from the film to react with the nitrate. The silane forms both silicon-oxygen and silicon-nitrogen bonds, and the water primarily evaporates. This creates bonded zone 715 of nitrox connecting nitrox 707 to nitrox 717, both now depleted of silane, and bonding the wafers. Bonded zone nitrox 715 has a thickness of roughly 500–800 Å μm and average values of x and y of roughly 0.8 and 0.2, respectively. Of course, increasing the ratio of $HNO_3$ to $H_2O_2$ will increase x and decrease y, and conversely for a decrease in the ratio.

(c) After bonding, remove the bulk of device wafer 702 and form isolated silicon islands for device fabrication as in the first preferred embodiment.

Silicon with dielectrics on both wafers plus additional silicon

Figure 8:
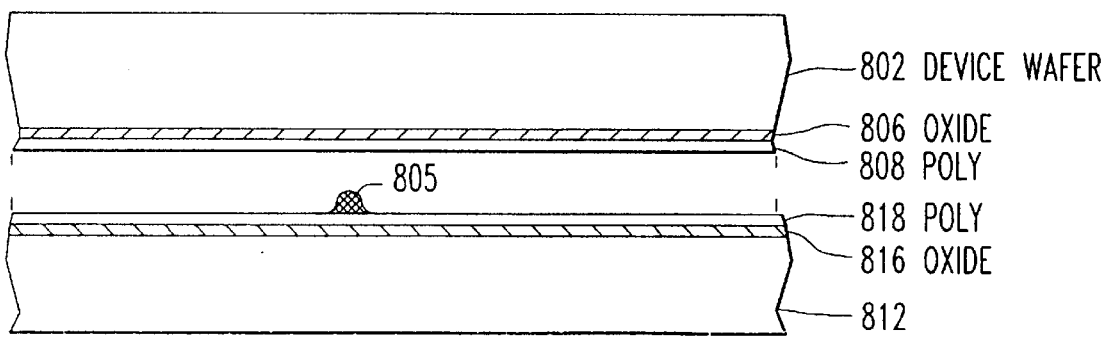
FIG. 8 is a cross-sectional elevation view of a further preferred embodiment.

FIG. 8 illustrates the starting wafers for a sixth preferred embodiment method of wafer bonding. Device wafer 802 has thermal oxide layer 806 of thickness 0.1–0.4 μm and polysilicon layer 808 of thickness 500 Å. Similarly, handle wafer 812 has deposited or thermally grown dielectric layer 816 of thickness 1 μm and may have polysilicon layer 818 of thickness 500 Å. Drop 806 contains silicon oxidizer $HNO_3$. When wafers 802 and 812 are pressed together and heated to 800°–1000° C. for 2–4 hours, the nitrate reacts with the polysilicon to form silicon-nitrogen and silicon-oxygen bonds (nitrox) linking oxide 806 to oxide 816 and bonding the wafers. The quantity of nitrate in drop 805 matches the quantity of polysilicon in layers 808 and 818 for stoichiometric nitrox, as follows. 1000 Å total thickness of polysilicon provides about $3\times10^{17}$ atoms of silicon per cm². With $HNO_3$ the only oxidizer, the reaction generates nitrox 815 through the reaction:

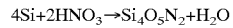

$$4Si + 2HNO_3 \rightarrow Si_4O_5N_2 + H_2O$$

Thus about $1.5\times10^{17}$ molecules of $HNO_3$ are needed per cm². With drop 805 of volume spreading out to about 4 microliters per cm², the concentration of $HNO_3$ in drop 805 must be about $4\times10^{22}$ molecules per liter, or about 0.07M.

The use of polysilicon 808 and 818 as the source of silicon permits more rapid bonding because silicon need not diffuse through oxides 806 and 816 to react. Indeed, oxides 806 and 816 could be replaced in part by nitrides which would be barriers to oxidation of the underlying wafer silicon, but the bonding would still proceed using silicon from polysilicon 806 and/or 816.

Silicidation bonding

FIGS. 9a–f illustrate in cross sectional elevation view a seventh preferred embodiment method of silicon-on-insulator bonded wafer processing.

(a) Begin with a four inch diameter 500 μm thick silicon device wafer 902 and a comparable diameter 500 μm thick silicon handle wafer 912. Device wafer 902 has the doping type and resistivity (e.g., N type and 20 ohm-cm resistivity) desired for eventual device fabrication. Thermally oxidize device wafer 902 to form oxide layer 916. Oxide 916 will become the bottom oxide, so the oxide is grown to the desired bottom oxide thickness; for example, 2–4 μm. Alternatively, diamond or silicon nitride ("nitride") could be deposited on device wafer 902 to form the buried dielectric layer 916. A diamond thin film 916 could be deposited by a chemical vapor deposition (CVD) reaction of methane and hydrogen, and a nitride thin film could be deposited by a decomposition of silane and ammonia Deposit 500 Å thick polysilicon layer 917 on oxide (or other dielectric) 916, or deposit a thicker polysilicon layer and polish it down to 500 Å. Then deposit 500–1000 Å thick platinum layer 918 on polysilicon 917; see FIG. 9a. The deposition of polysilicon may be by silane decomposition and the deposition of platinum may be by sputtering. Handle wafer 912 only has native oxide on its surfaces.

Figure 9A:
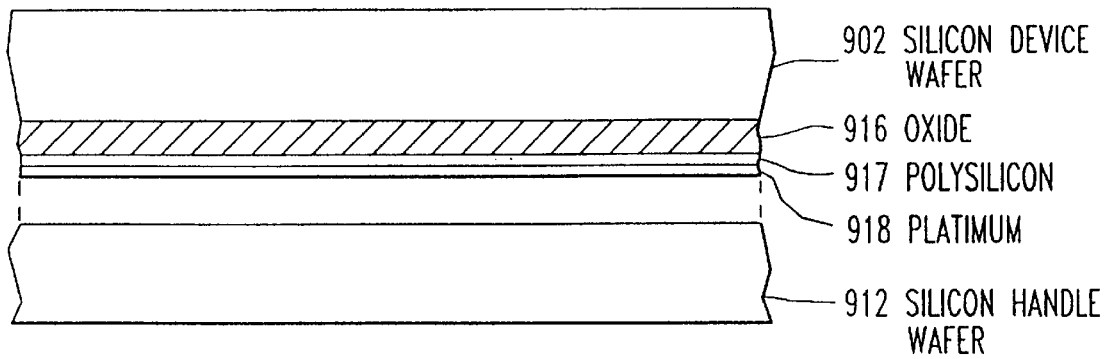
FIGS. 9a–9g show a seventh preferred embodiment method of wafer bonding together with resulting device cross-sections.
Figure 9B:
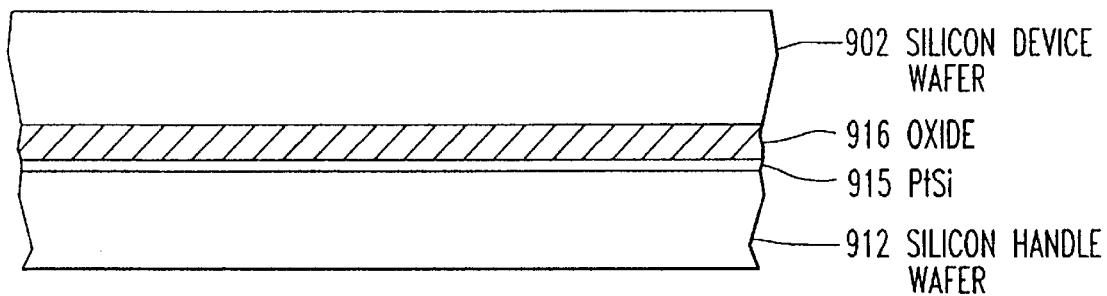
Figure 9C:
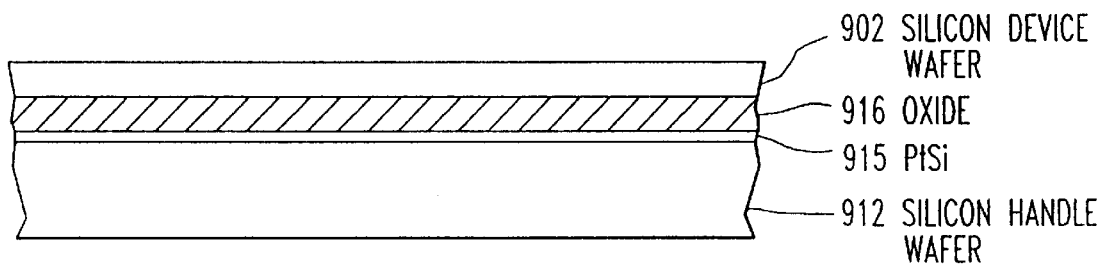
Figure 9D:
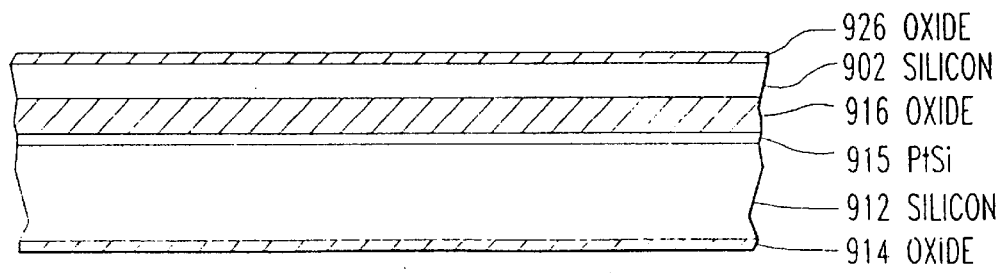
Figure 9E:
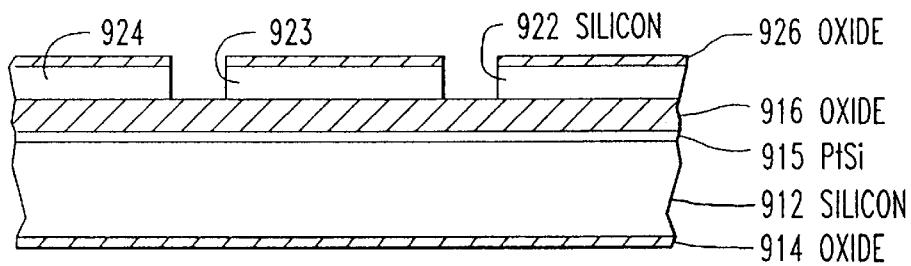
Figure 9F:
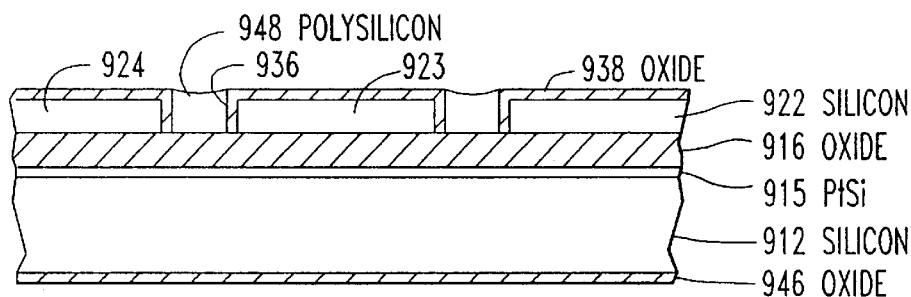

(b) Press handle wafer 912 and device wafer 902 together and heat them to 500° C. in a 2–6 hour furnace cycle with a nitrogen or forming gas ambient. This drives platinum 918 to react with silicon 912 and polysilicon 917 and form platinum silicide, PtSi, and thereby bind the wafers together. Native oxide on handle wafer 912 dissolves in the PtSi and does not prevent the silicidation. This low temperature bonding depends upon the silicidation reaction and not on thermal oxidation as in the process of FIGS. 2a–c. See FIG. 9b showing PtSi layer 915. The platinum forms silicon-platinum bonds with both device wafer silicon 912 and polysilicon 917. The deposition of polysilicon 917 on oxide (or other dielectric) 916 had previously formed silicon-oxygen (or silicon-carbon or silicon-nitrogen) bonds and bound polysilicon 917 to oxide (dielectric) 916. The silicidation of polysilicon 917 retains these silicon bonds and thus binds device wafer 902 binds to handle wafer 912 through silicon/silicide and silicide/dielectric interfaces. The reaction basically is:

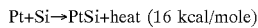

Pt+Si→PtSi+heat (16 kcal/mole)

Bonded zone PtSi 915 has a thickness of roughly 600–1000 Å.

(c) After bonding, remove the bulk of device wafer 902 by grinding, lapping, and polishing to leave the desired device island thickness; for example, 35–40 μm. This thinning of device wafer 902 proceeds without any etchstop, so the final thickness of device wafer 902 depends upon process control. See FIG. 9c. The use of an etchstop permits much smaller device island thicknesses, such as 1 μm.

(d) Deposit mask oxide 926 on device wafer 902 to a thickness of about 4 μm. PtSi is stable up to 550 C., so thermal oxidation may not be used. However, other refractory metals such as cobalt and nickel form silicides which are stable to above 900 C., so thermal oxidation could be used with bonding by such silicides. Mask oxide 926 will be used as a trench etch mask. See FIG. 9d. Thermal oxidation will also grow oxide 914 on the backside of handle wafer 912.

(e) Print a trench pattern into photoresist spun onto mask oxide 926. Note that for thermal oxidation, the bottom oxide (or other dielectric) 916 (4 μm), the mask oxide 926 (4 μm) and the backside oxide 914 (4 μm) are all fairly closely matched in thickness during the photoresist patterning, and bond silicide layer 915 is fairly thin. This provides a rough stress balance and limits warpage of the bonded wafers. Alternatively, with PtSi or other silicide with limited temperature stability and deposited mask oxide, the process temperature cycling has had limited excursions, so warpage is not as great a problem. Use the patterned photoresist as etch mask to wet etch (HF) the trench pattern in oxide 926. Then strip the photoresist and use the patterned oxide 926 to plasma reactive ion etch (RIE) device wafer 902 to form silicon islands 922, 923, . . . on oxide layer 916. This etch stops on oxide or other dielectric 916; see FIG. 9e.

(f) Strip patterned oxide 926 with a wet etch. This etch also removes the remaining backside oxide 914 on the back of handle wafer 912. Then thermally grow or conformally deposit (depending upon silicide thermal stability) oxide to a thickness of 4 μm to form isolation oxide 936 on the sides of islands 922, 923, . . . This also forms 4 μm of oxide 938 on the island surfaces and 4 μm of backside oxide 946 on handle wafer 912. Next, deposit polysilicon 948 to fill the trenches. Lastly, planarize to remove the polysilicon except from the trenches. See FIG. 9f. Note that again the island surface oxide 938, bottom oxide 916, and backside oxide 946 all have about the same thickness (4 μm) which limits warpage due to stress differentials.

Figure 9G:
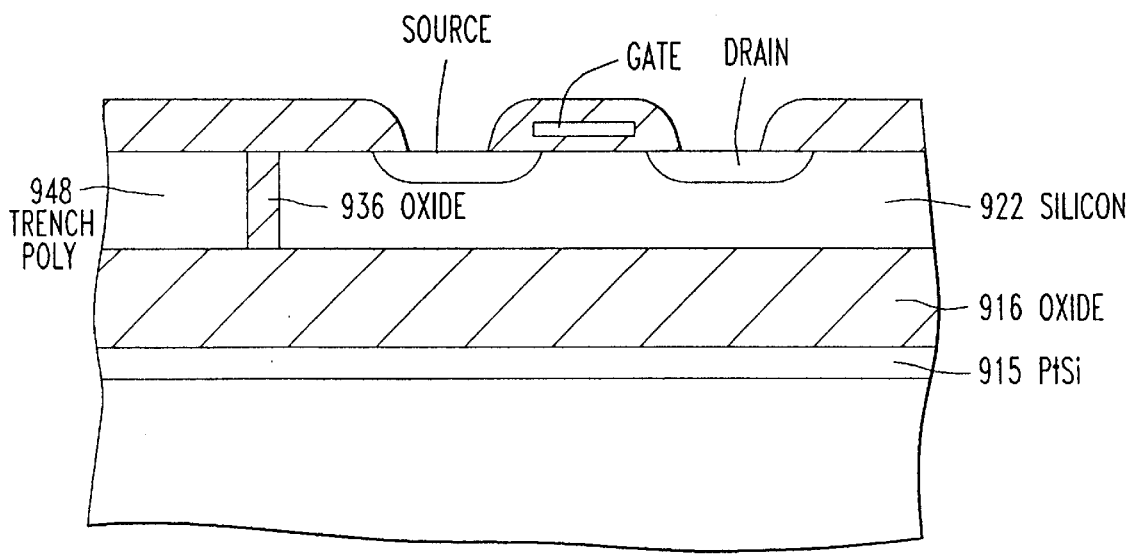

(g) Fabricate devices in the silicon islands. The particular fabrication steps used will depend upon the types of devices, interconnection structure, and insulations desired and can include oxide growth and deposition, photoresist patterning, wet and dry etches, diffusions and implants, various material depositions such as polysilicon and nitride, epitaxial layer growth, deposition of various metals such as aluminum and tungsten, and chemomechanical polishing. FIG. 9g schematically shows in expanded cross sectional elevation view a partially completed MOSFET in island 922 which would be just one of thousands of such devices in an integrated circuit fabricated on the bonded wafer.

An advantage of silicon-on-insulator integrated circuits with devices overlying bottom oxide (or other dielectric) 916 plus bond PtSi (or other silicide) layer 915 rather than just bottom oxide layer 916 alone includes their extra charge dissipation along silicide layer 915, their better thermal dissipation in the case of diamond films 916 along silicide 915, and their silicide diffusion barrier to prevent contaminants from diffusing upward from the handle wafer or bonded zone. In addition, these integrated circuits were produced on wafers which had much lower thermal budgets due to the low temperature wafer bonding by silicidation. This results in less inherent stress, especially in the case of diamond films 916, and less dopant and contaminant diffusion.

Dielectrically isolated silicidation bonding

Figure 10A:
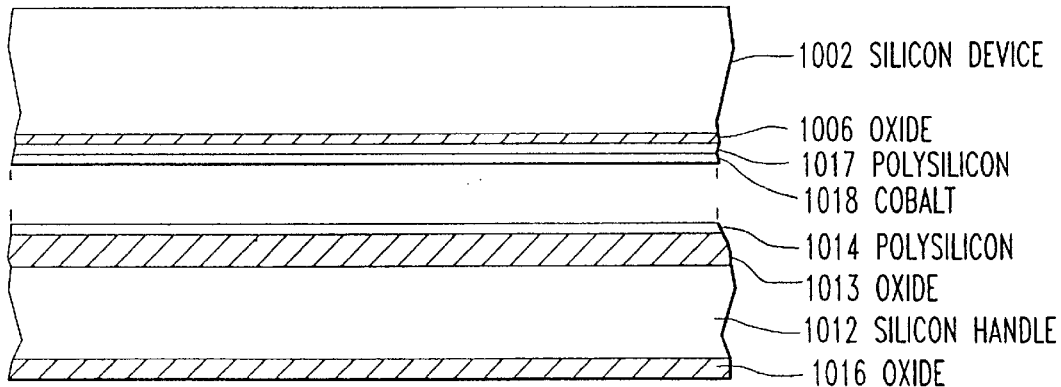
FIGS. 10a–10d are an eighth preferred embodiment.
Figure 10B:
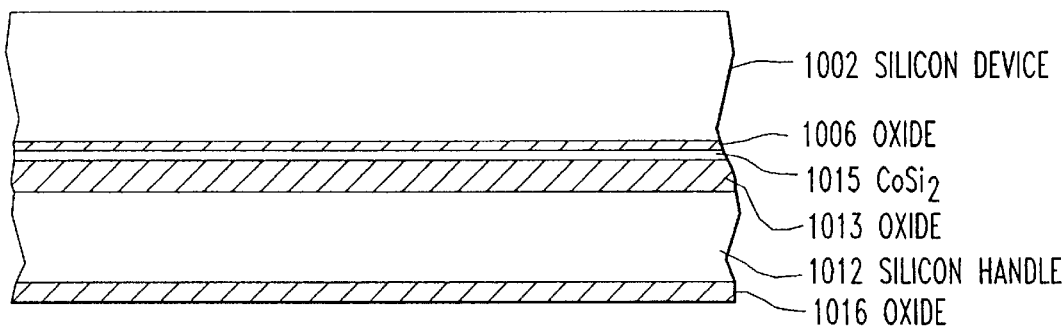
Figure 10C:
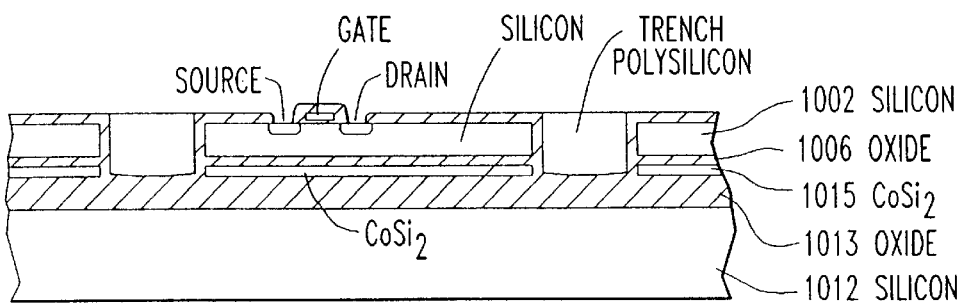

FIG. 10a–c illustrate in cross sectional elevation view a eighth preferred embodiment method of bonded wafer processing.

(a) Begin with a six inch diameter 600 μm thick silicon device wafer 1002 and a comparable diameter 600 μm thick silicon handle wafer 1012. Device wafer 1002 has the doping type and resistivity, including any buried layer doping, desired for eventual device fabrication and has a 500 Å thick thermal oxide layer 1006, 500 Å thick polysilicon layer 1017, and 1000 Å thick cobalt layer 1018 on its bonding surface. Thermally oxidize handle wafer 1012 to form oxide layers 1016 and 1013. Oxide 1013 will become the bottom oxide, so the oxide is grown to the desired bottom oxide thickness; for example, 3 μm. Again, alternative bottom dielectrics could be deposited: diamond, nitride, oxynitride, multiple layers of different dielectrics, and so forth. Oxide 1016 provides stress compensation to restrain warpage. Deposit 500 Å thick polysilicon layer 1014 on oxide (dielectric) 1013; see FIG. 10a. The deposition of polysilicon may be by silane decomposition and the deposition of cobalt may be by sputtering.

(b) Press handle wafer 1012 and device wafer 1002 together and heat them to 800° C. in a 2–6 hour furnace cycle with a nitrogen or other inert ambient. This drives cobalt 1018 to react with polysilicon 1014 and polysilicon 1017 and form cobalt silicide, $CoSi_2$, and thereby bind the wafers together. This low temperature bonding depends upon the silicidation reaction and not on thermal oxidation as in the process of FIGS. 2a–c. See FIG. 10b showing $CoSi_2$ layer 1015. The cobalt forms silicon-cobalt bonds with both polysilicon 1014 and polysilicon 1017. The deposition of polysilicon 1017 on oxide 1006 had previously formed silicon-oxygen bonds and bound polysilicon 1017 to oxide 1006; similarly, polysilicon 1014 is bound to oxide 1013. The silicidation of polysilicon 1014 and 1017 retains these silicon/oxygen bonds and thus device wafer 1002 binds to handle wafer 1012 through silicon/oxide and silicide/oxide interfaces. Bonded zone $CoSi_2$ 1015 has a thickness of roughly 600–1000 Å. Note that cobalt forms the silicide in preference to reducing the oxide by $SiO_2 + Co \rightarrow Si + CoO_2$.

(c) After bonding, remove the bulk of device wafer 1002 by grinding, lapping, and polishing to leave the desired device island thickness; for example, 20 $\mu$m. This thinning of device wafer 1002 proceeds as in the seventh preferred embodiment, as does subsequent device fabrication. Because thermal oxide 1006 is quite thin, the trench etch will remove it, and the exposed $CoSi_2$ can then also be removed. Then a trench sidewall oxidation plus conformal oxide deposition will isolate the $CoSi_2$ layer under each silicon island between the trenches. See FIG. 10c.

Figure 10D:
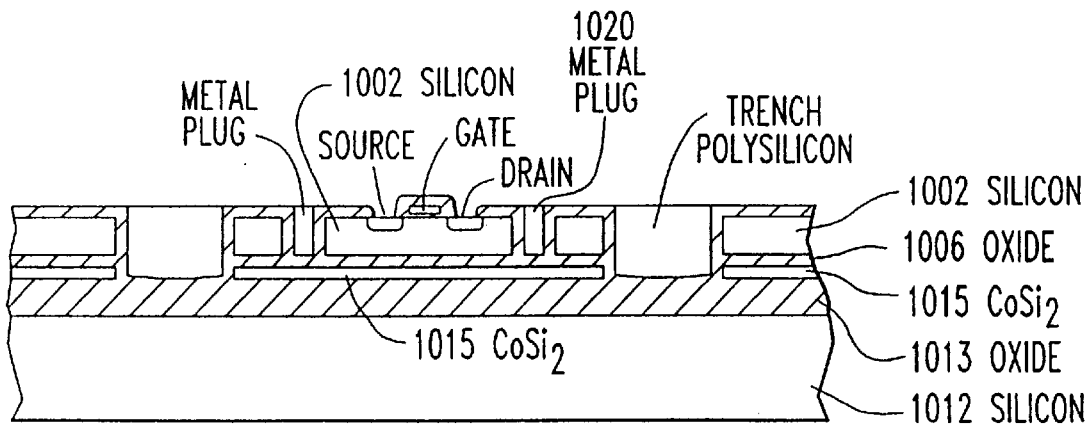

The structure of the eighth preferred embodiment has the advantage that $CoSi_2$ layer 1015 can act both as a resistor under each silicon island and as a diffusion barrier for impurities diffusing out of bottom oxide (dielectric) 1013 during processing. Thin thermal oxide 1006 provides the electrical isolation of $CoSi_2$ 1015 from its silicon island. Such buried resistors help in three-dimensional integration by allowing vertical integration, thus providing smaller die geometries. FIG. 10d illustrates use of $CoSi_2$ as a resistor stacked directly below the silicon island. In particular, contacts to $CoSi_2$ 1015 may be made by another trench etch which stops on the silicide followed by oxidation of trench sidewalls and filling with a metal plug 1020 such as tungsten. This resistor contact formation may be most convenient with thin silicon islands; that is, when silicon 1002 is about 2 $\mu$m of less in thickness. The resistance of such resistors may be adjusted by varying the silicide thickness/composition or silicon island size.

Silicidation plus oxidation bonding

Figure 11A:
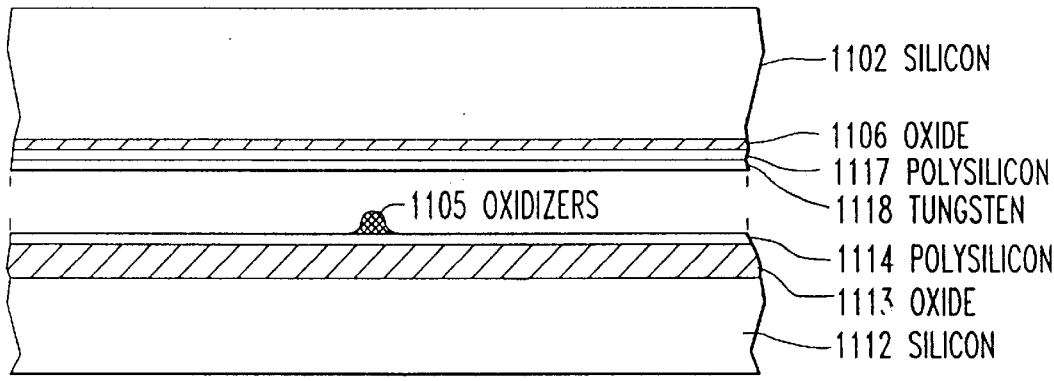
FIGS. 11a–11b show a ninth preferred embodiment.
Figure 11B:
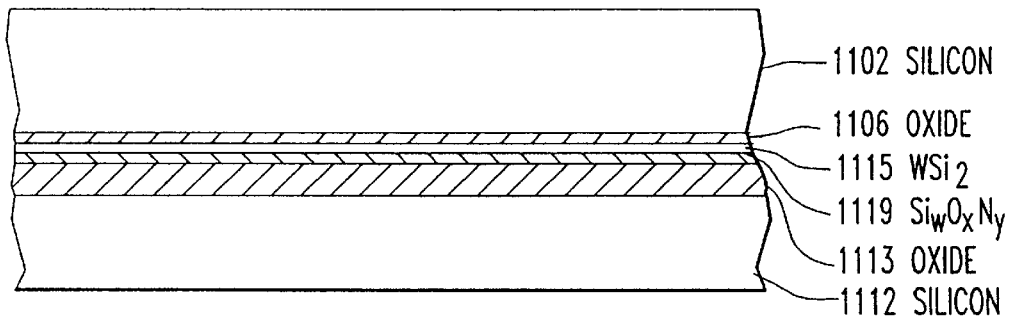

FIGS. 11a–b illustrate in cross sectional elevation view a ninth preferred embodiment method of bonded wafer processing.

(a) Begin with a six inch diameter 600 $\mu$m thick silicon device wafer 1102 and a comparable diameter 600 $\mu$m thick silicon handle wafer 1112. Device wafer 1102 has the doping type and resistivity desired for eventual device fabrication and has a 500 Å thick thermal oxide layer 1106, 500 Å thick polysilicon layer 1117, and 1000 Å thick tungsten layer 1118 on its bonding surface. Thermally oxidize handle wafer 1112 to form oxide layer 1113. Oxide 1113 will become the bottom oxide, so the oxide is grown to the desired bottom oxide thickness; for example, 2 $\mu$m. Deposit 500 Å thick polysilicon layer 1114 on oxide 1113. The deposition of polysilicon may be by silane decomposition and the deposition of tungsten may be by sputtering. Place drop 1105 of oxidizing aqueous solution of $HNO_3$ and $H_2O_2$ on polysilicon 1114; see FIG. 11a. Drop 1105 is 20% by volume a 67% $HNO_3$ solution and 80% by volume a 30% $H_2O_2$ solution. Other mixtures also work. Drop 1105 has a volume of about 0.05 cc which implies 4.0 microliters per square inch of wafer surface and theoretically will spread out to a layer with thickness (if uniform) of 6 $\mu$m on polysilicon 1114. Note that drop 1105 wets the surface of polysilicon 1114. (Drop volume in the range of 4 to 10 microliters per square inch of wafer surface leads to good bonding.)

(b) Press handle wafer 1112 and device wafer 1102 together with drop 1105 of seventh preferred embodiment oxidizer on the surface of polysilicon 1114. Let the pressed together wafers dry for 24 hours and then heat them to 900° C. in a 2–6 hour furnace cycle with an oxidizing ambient. This drives polysilicon 1117 to react with tungsten 1118 to form tungsten silicide, $WSi_2$, and drives oxidizer 1105 to react with polysilicon 1114 to form silicon oxynitrides ("nitrox"). The tungsten also reacts with the nitrox to thereby bind the wafers if polysilicon 1114 is consumed. See FIG. 11b. The tungsten forms tungsten-silicon bonds, and the nitrate forms both silicon-oxygen and silicon-nitrogen bonds. The water primarily evaporates. The reactions basically are:

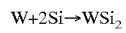

The oxidizer in drop 1105 oxidizes the portion of polysilicon 1114 not consumed by the silicidation. This creates a bonded zone with a mixture of nitrox 1119 connecting bottom oxide 1113 plus handle wafer 1102 to silicide 1115 plus oxide 1106 and device wafer 1102. Bonded zone nitrox 1119 has a thickness of roughly 500–800 Å and silicide layer 1115 has a thickness of about 800–1000 Å. Of course, increasing the ratio of $HNO_3$ to $H_2O_2$ in oxidizer drop 1105 will increase x and decrease y and somewhat increase the thickness of bonded zone nitrox 1119; and conversely for a decrease in the ratio. If there is a shortage of polysilicon, then the oxidizer oxidizes the silicide:

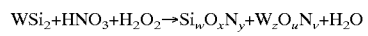

(c) After bonding, remove the bulk of device wafer 1102 by grinding, lapping, and polishing to leave the desired device island thickness and fabricate devices as with the seventh preferred embodiment. As with the eighth preferred embodiment, the silicide layer may be isolated under each silicon island and form a buried resistor. The resistance of such resistors may be adjusted by varying the thickness of the polysilicon and tungsten (or other metal) layers in the initial wafers and/or the size of each device islands. Indeed, silicide thicknesses down to 200 Å can provide sufficient bonding strength together with a more convenient sheet resistivity.

Silicide silicidation

The tenth preferred embodiment method of bonded wafer processing follows the steps of any of the preceding three silicide preferred embodiments but replaces the metal (platinum, cobalt, and tungsten) with a silicide (or metal plus silicide mixture) which can further react with silicon. For example, $TiSi + Si \: TiSi_2$. Again, the buried dielectric could be diamond, nitride, nitrox, multilayered, and so forth.

Diamond buried dielectric

Figure 12:
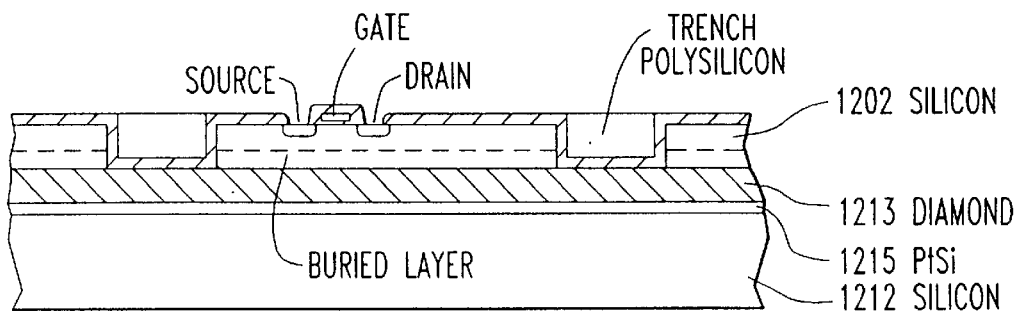
FIG. 12 illustrates a variant with buried diamond layer.

FIG. 12 shows a cross sectional elevation view of a buried diamond structure in which device wafer 1202 had diamond film 1213 grown and then polysilicon deposited on the diamond and platinum deposited on the polysilicon. The polysilicon and the handle wafer silicon both react with the platinum to form PtSi 1215 to bind the wafers at 500 C. as in the seventh preferred embodiment method. Diamond 1213 requires low temperature bonding in order to avoid warpage, and the lack of any oxide layers provides high thermal conductivity from devices in device wafer 1202 through diamond insulator 1213 and bonding silicide 1215 and into handle wafer 1212. Diamond 1213 and silicide 1215 also provide lateral spreading of heat and limit hot spots in device wafer 1202. The trench isolation in FIG. 12 includes deposited oxide, again to avoid high temperature processing of diamond film 1213, and polysilicon trench filler. Devices such as the illustrative field effect transistor could be situated over buried layers which are formed by simply introducing dopants prior to the growth of diamond film 1213, and these dopants to not excessively diffuse during processing because of the small thermal budget used with diamond films.

Silicon and sapphire

FIGS. 13a–f illustrate in cross sectional elevation view a eleventh preferred embodiment method of bonded wafer processing.

(a) Begin with a four inch diameter 500 µm thick silicon device wafer 1302 and a comparable diameter aluminum oxide (sapphire) handle wafer 1312. Device wafer 1302 has the doping type and resistivity (e.g., N type and 20 ohm-cm resistivity) desired for eventual device fabrication and has only native oxide on its surfaces. Place drop 1305 of silicon-oxidizing aqueous solution of $HNO_3$ and $H_2O_2$ on sapphire wafer 1312; see FIG. 13a. Drop 1305 is 20% by volume a 67% $HNO_3$ solution and 80% by volume a 30% $H_2O_2$ solution. Other oxidizers and mixtures also work. Drop 1305 has a volume of about 0.05 ml which implies about 4 microliters per square inch of wafer surface and theoretically will spread out to a layer with thickness (if uniform) of 6 µm on sapphire 1312. Note that drop 1305 wets the surface of sapphire 1312. Drop volume in the range of 4 to 10 microliters per square inch of wafer surface provides good bonding.

(b) Press handle wafer 1312 and device wafer 1302 together with drop 1305 of eleventh preferred embodiment oxidizer on the surface of wafer 1312. Let the pressed together wafers dry for 24 hours and then heat them to 800°–1000° C. in a 2–6 hour furnace cycle with an oxidizing ambient. This low temperature bonding does not depend primarily on thermal oxidation of silicon as in the process of FIGS. 2a–c, but is coupled with an oxidation reduction reaction of nitrate oxidizing the silicon of wafer 1302 coupled with slow thermal oxidation. See FIG. 13b. The nitrate forms both silicon-oxygen and silicon-nitrogen bonds. The silicon oxidation reaction also provides sufficient energy to form cross linking bonds between the sapphire surface and the silicon oxynitride by double bonds being replaced by pairs of single bonds. In effect, mixtures of silicon oxides and nitrides with aluminum oxides form in a bonded zone, and the water primarily evaporates.

The reactions heuristically are:

$Si+HNO_3 \rightarrow SiO_xN_y+H_2+H_2+O_2$ $Si=O+Al=O \rightarrow Al<^o_o>Si$

The oxide mixtures may include aluminum silicate (mullite) $Al_6Si_2O_{13}$. This creates bonded zone 1315 of a mixture of aluminum silicon oxynitrides connecting the remainder of device wafer 1302 to handle wafer 1312. Bonded zone 1315 has a thickness of roughly 500–800 Å and average values of x and y of roughly 0.8 and 0.2, respectively. Of course, increasing the ratio of $HNO_3$ to $H_2O_2$ will increase x and decrease y and somewhat increase the thickness of bonded zone 1315; and conversely for a decrease in the ratio. Note that using very little (or none) $HNO_3$ requires the higher temperatures of the process of FIGS. 2a–c because the oxidation of silicon 1302 becomes almost totally thermal oxidation.

(c) After bonding, remove the bulk of device wafer 1302 by grinding, lapping, and polishing to leave the desired device island thickness; for example, 35–40 µm. This thinning of device wafer 1302 proceeds without any etchstop, so the final thickness of device wafer 1302 depends upon process control. See FIG. 13c. The use of an etchstop permits much smaller device island thicknesses, such as 1 µm.

(d) Thermally grow mask oxide 1326 on device wafer 1302 to a thickness 4 µm, this will not affect bond layer 1315 or handle sapphire 1312. Mask oxide 1326 will be used as a trench etch mask. See FIG. 13d.

(e) Print a trench pattern into photoresist spun onto mask oxide 1326. Use the patterned photoresist as etch mask to wet etch (HF) the trench pattern in oxide 1326. The wet etch has no effect on sapphire 1312. Then strip the photoresist and use the patterned oxide 1326 to plasma reactive ion etch (RIE) device wafer 1302 to form silicon islands 1322, 1323, . . . on bond nitrox layer 1315. See FIG. 13e.

(f) Strip patterned oxide 1326 with a wet etch. Then thermally grow oxide to a thickness of 4 µm to form isolation oxide 1336 on the sides of islands 1322, 1323, . . . . This also forms 4 µm of oxide 1338 on the island surfaces. Next, deposit polysilicon 1348 to fill the trenches. Lastly, planarize to remove the polysilicon except from the trenches. See FIG. 13f.

Figure 13A:
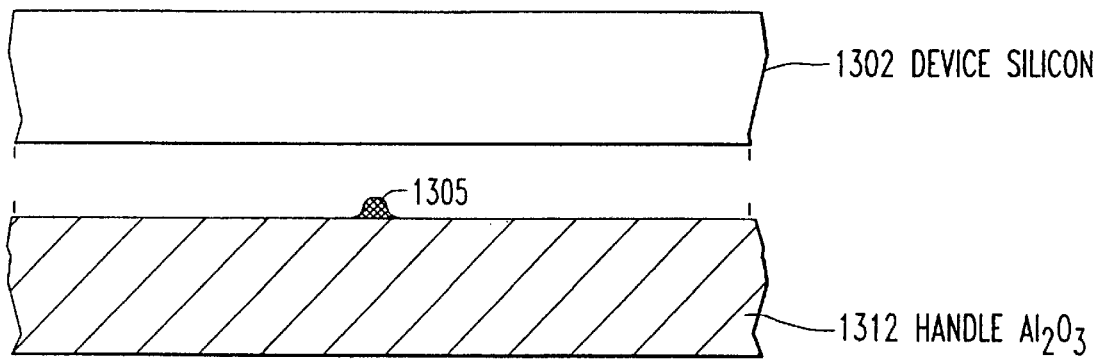
FIGS. 13a–13g show a eleventh preferred embodiment method of wafer bonding together with resulting device cross-sections.
Figure 13B:
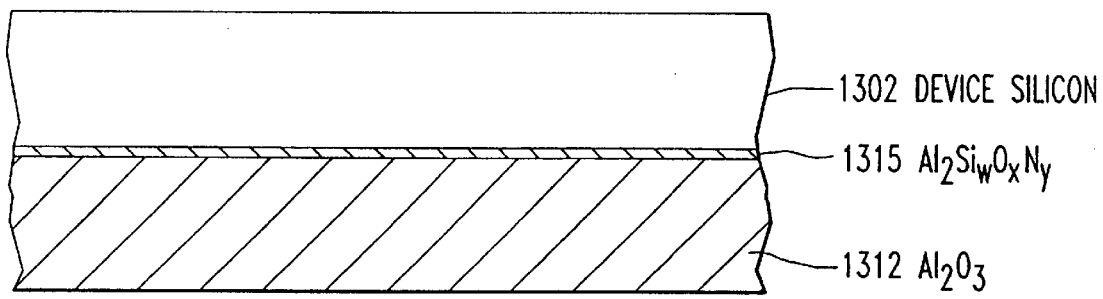
Figure 13C:
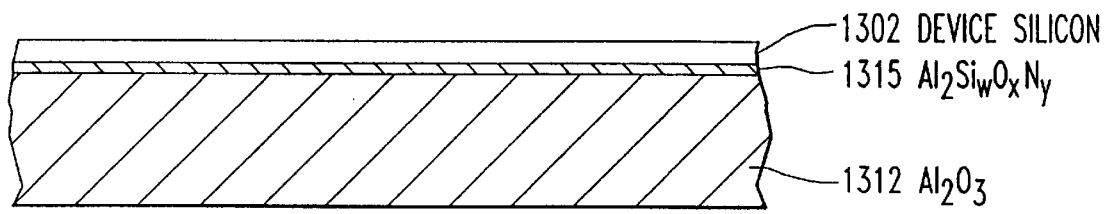
Figure 13D:
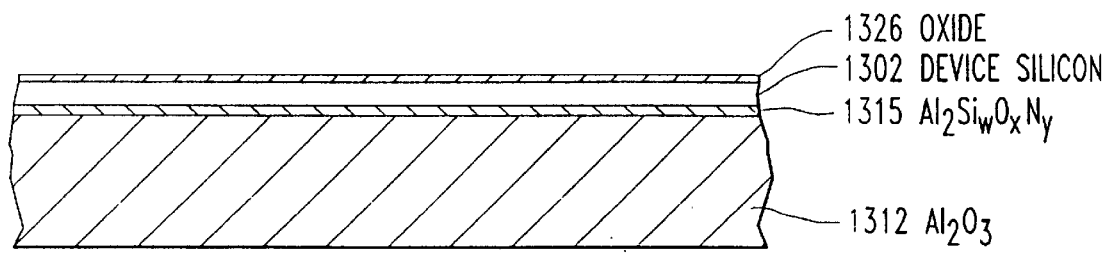
Figure 13E:
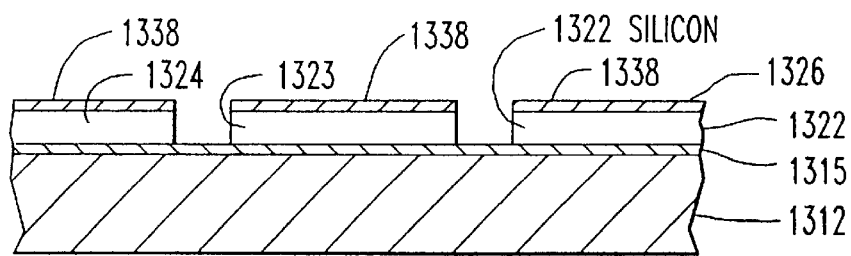
Figure 13F:
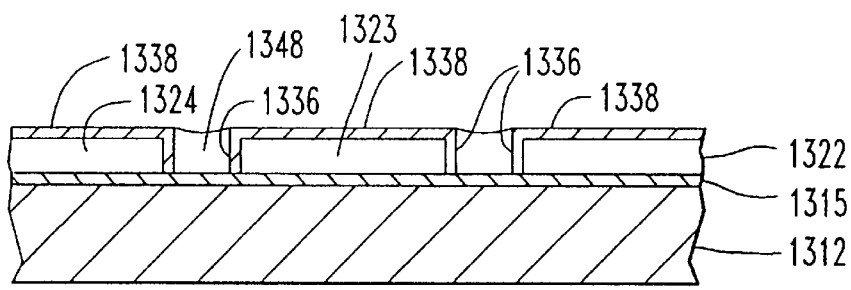
Figure 13G:
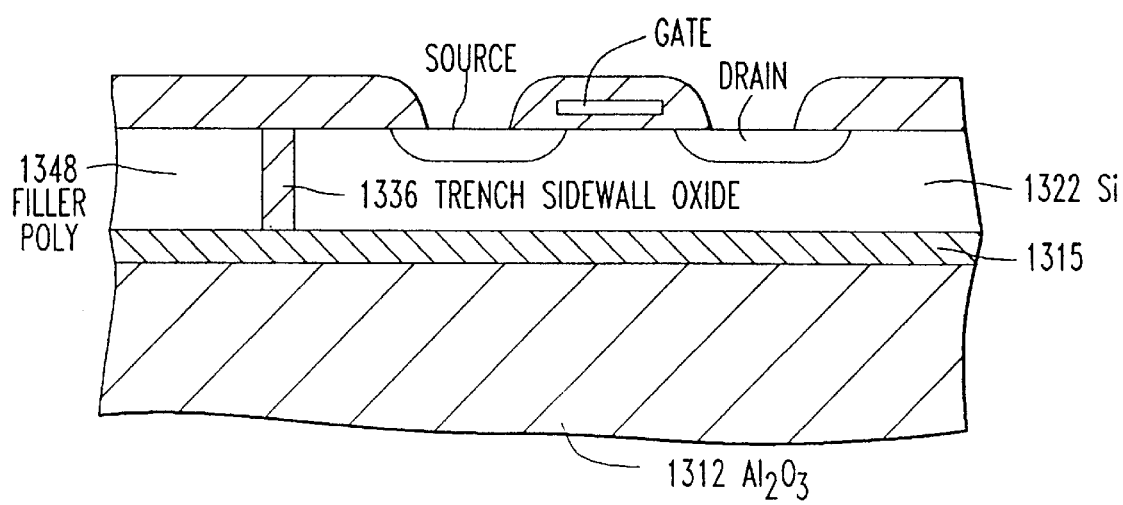

(g) Fabricate devices in islands 1322, 1323, . . . The particular fabrication steps used will depend upon the types of devices, interconnection structure, and insulations desired and can include oxide growth and deposition, photoresist patterning, wet and dry etches, diffusions and implants, various material depositions such as polysilicon and silicon nitride, epitaxial layer growth, deposition of various metals such as aluminum an tungsten, and chemomechanical polishing. FIG. 13g illustrates in magnified view a partially completed MOSFET in island 1322 which would be just one of thousands of such devices in an integrated circuit fabricated on the bonded wafer.

An advantage of silicon-on-sapphire integrated circuits as compared with silicon-on-insulator (oxide) integrated circuits lies in their radiation hardness. And the eleventh preferred embodiment has the advantage of silicon bonded to sapphire rather than difficult epitaxial growth of silicon on sapphire. Further, the bonded zone of a mixture of aluminum silicon oxynitrides connecting the wafers provides a layer of intermediate thermal expansion coefficient. This, together with the lower temperature bonding, lessens the interface stresses in the bonded wafer.

Silicon and sapphire plus dopants

The twelfth preferred embodiment method of bonded wafer processing follows the steps of the eleventh preferred embodiment method but augments or replaces the oxidizer of drop 1305 by a silicon oxidizer such as aqueous $HClO_4$. For example, the drop could be 50% $HNO_3$, 20% $HClO_4$ and 30% $H_2O_2$, or 100% $HClO_4$. The same relatively low temperature bonding occurs, and the chlorine ends up bonded in the interface bond layer. Of course, other oxidizers of silicon and/or dopants could be incorporated in the oxidizer liquid and produce relatively low temperature bonding. These oxidizers will leave the dopants at the silicon/dielectric interface in the bonded layer; or if the dopants diffuse in silicon, lead to a doped buried layer in silicon islands 1322, 1323, . . . Indeed, augmenting the oxidizer of drop 1305 with buried layer dopants such as As, P, B, Sb, . . . which will diffuse into the bottoms of silicon 1302 during bonding will lead to buried layers. That is, in addition to $HNO_3$ for relatively low temperature bonding, drop 1305 contains dopants such as $As_2O_3$, $POCl_3$, . . . which will generate the electrically active dopants such as As, P, B, Sb,. in the device wafer during bonding. A portion of these dopants will diffuse to form a uniform buried layer in device wafer 1302. The doping concentrations of the buried layers in the silicon depends upon the quantity of dopants initially introduced into drop 1305. For example, if drop 1305 were 1% dopant, then the drop would provide a dose on the order of $10^{18}$ dopant atoms per $cm^2$ of interface. Thus drop 1305 can easily accomodate sufficient dopants even if only a small fraction of the dopants actually migrate out of the bonded zone during oxynitride layer growth; the oxynitride may be a diffusion barrier. Conventional implantation of a buried layer typically uses an implant dose on the order of $10^{16}$ dopant atoms/$cm^2$, so only 1% of the dopants duffusing into the silicon suffices. Further, implantation will produce a long tail, as previously mentioned, whereas diffusion gives a better dopant profile. Bonding at 1000° C. will help diffuse the dopants in the silicon and may be useful with thicker silicon islands.

Of course, a high temperature direct bonding with these dopants would also yield buried layers, but the high direct bonding temperatures would diffuse the dopant much further into islands 1322, 1323, . . . and would not be useful for the case of very thin islands. For example, if islands 1322, 1323, . . . were only 1 µm thick, then a 2–6 hours bonding at 1150° C. would drive dopants throughout the islands.

GaAs and silicon

The thirteenth preferred embodiment method follows the steps of the eleventh and twelfth preferred embodiment methods, but uses a gallium arsenide (GaAs) wafer in place of the sapphire wafer 1312. The drop of oxidizer between the wafers oxidizes the material in both wafers to form linking oxide bonds. Indeed, all of the constituents form multicovalent oxides: $SiO_2$, $Ga_2O_3$, and $As_2O_3$ or $As_2O_5$ and thus links such as Si—O—As and Si—O—Ga will bond the wafers. Similarly, all of the constituents form nitrides and oxynitrides. Thus the oxidizer may again be $HNO_3$ for low temperature reaction. Note that GaAs loses arsenic at high temperatures, so low temperature bonding reactions are needed, plus the backside surface of the GaAs wafer may be capped to deter arsenic loss.

Oxidizers such as $HNO_3$ and dichromate may release various dopants such as O, N, and Cr which dope the GaAs to a semi-insulating condition.

Because silicon wafers typically possess greater mechanical strength than GaAs wafers, the GaAs wafer may be thinned down for device fabrication with the oxides or oxynitrides at the bonding interface providing a buried insulating layer. Further, the thinned GaAs plus the underlying bonding insulator layer may be totally removed in some regions to permit fabrication of bulk silicon devices.

Figure 14:
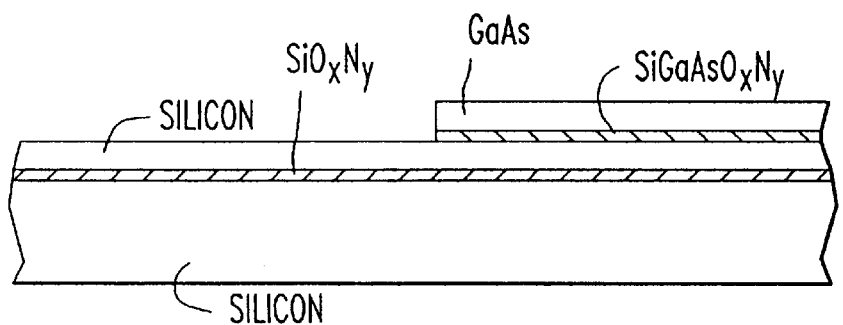
FIGS. 14 and 15 illustrate thirteenth and fourteenth preferred embodiments.

A two-step wafer bonding method of first bonding device silicon to handle silicon and then thinning the device silicon and bonding device GaAs to the thinned device silicon provides further variations in that both GaAs on insulator and silicon on insulator can be realized on the same handle silicon wafer. FIG. 14 heuristically illustrates such a semiconductor on insulator structure where the GaAs has been removed from the lefthand portion of the wafer.

Oxidizers which can provide low enough temperatures (less than 900 C.) for GaAs bonding include $HNO_3$, $H_2O_2$, . . .

Silicon and silicon carbide

The fourteenth preferred embodiment method follows the steps of the third preferred embodiment method, but with a silicon carbide wafer in place of the GaAs wafer. The robustness of silicon carbide permits higher temperatures for bonding than does GaAs. Oxidizing liquids for bonding silicon to silicon carbide include dichromate. The chromium has a coordination number of six and the Cr=O double bonds essentially split to form single Cr—O bonds plus react to form C—Cr, Si—Cr, and O—Si bonds with the surface carbon and silicon. The reaction heuristically amounts to

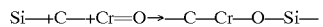

and thereby bonds the two wafers with an insulating bonded zone.

Alternatively, an oxidizer such a nitrate could bond to the silicon in silicon carbide and release the carbon as carbon dioxide:

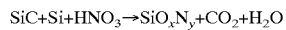

After bonding, the silicon carbide layer is thinned. Silicon carbide provides a substrate for fast devices and can be partially removed analgous to the GaAs of FIG. 14 to provide silicon for standard bulk devices.

Modifications and Variations

The preferred embodiments can be modified in various ways while retaining the bonding of wafers with chemical reactants which react to form a bonded zone of one or more new materials which bind the wafers and with, optionally, dopants introduced from the reactants.

Figure 15:
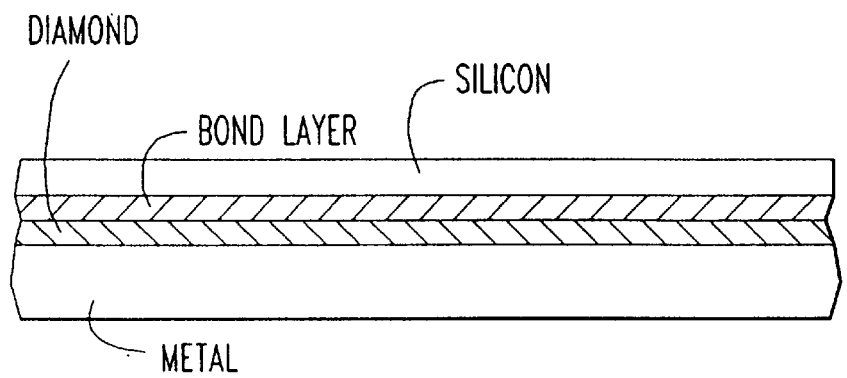

For example, the handle wafer could be a thermally-conductive structure such as diamond on metal and a low temperature bonding such as PtSi used to attach a silicon device wafer without disrupting the diamond; FIG. 15 shows the after thinning. Also, metal and silicon, or other silicide precursors, could be on one of or both of the device and handle wafers which are brought together to bond. Further, many different refractory metals form various silicides at various temperatures and with various temperature stability ranges. Thus, the type of dielectric and other materials involved and the processing steps to be used in device fabrication will determine thermal budgets and the choice of available silicides. For example, platinum is good for low temperature processing, whereas nickel and tungsten permit higher temperature processing. Also, some metals, such as titanium, tantalum, and platinum, easily dissolve or penetrate native oxides on wafer surfaces to form silicides, whereas cobalt is notorious for silicidation difficulties in the presence of native oxides. Note that for many metals the metal migrates in the silicon to form silicides, but for tungsten, the silicon migrates in the metal; this difference permits differing bonded zone reaction systems. Lastly, the metal may be chosen to minimize the differences between thermal coefficients of expansion of the silicide, dielectric, and wafers.

Device characteristics

Figure 16:
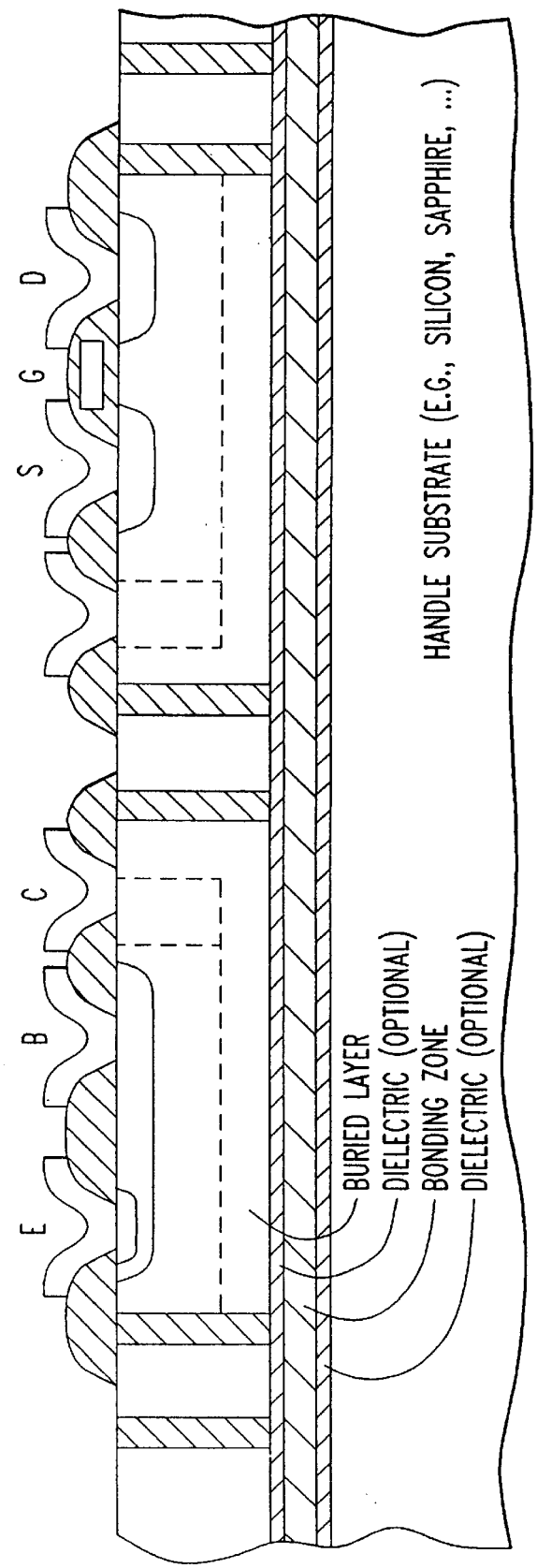
FIG. 16 shows device cross-sections.

Devices and integrated circuits fabricated in dice from the bonded wafers of the preferred embodiment methods are heuristically illustrated in cross sectional elevation view in FIG. 16 and have one or more of the following properties:

(a) Stress and warpage reduction due to (i) buried layers and substrates with closely matched thermal coefficients of expansion and (ii) low temperature bonding, especially for diamond dielectric;

(b) Buried layers which can function as diffusion barriers to limit the diffusion of mobile contaminants;

(c) Tight dopant profiles of buried layers due to prebonding processing together with low thermal budgets of the reactive bonding and avoidance of implantation with its dopant profile tailing and subsequent defect anneal;

(d) Dielectrically isolated conductive buried layers which can function as resistor films;

(e) Buried layers with high thermal conductivity, such as diamond films.

(f) Radiation hardened buried insulators for increased radiation tolerance in military and space IC applications without the characteristics of implanted hardening such as silicon crystal damage from implanting and conducting "pipe"in the buried dielectric which can result from surface particulates preventing the correct implant dosage from reaching the buried layer in the silicon to form a stoichiometric dielectric.

Controlling the bonding liquid and/or solid and overall dielectric thicknesses promotes unstressed chemical bonding gradients between the deposited dielectric(s) and the reacted dielectric or silicide. Maintaining minimum film thicknesses is critical in helping to eliminate localized stress caused by dissimilar materials. It is imperative that the bonding liquid provide the correct elements and oxidative potential to not etch the deposited dielectric, as well as create read layers with compatible coefficients of thermal expansion. This will allow a chemical bonding transition from deposited dielectric(s) through the bonded zone into the wafers. This is accomplished by controlling the elements in the bonding liquid and/or solid, molar concentration ratios, solution volumes, solid thicknesses, and bonding temperature.

What is claimed is:

1. A method of wafer bonding, comprising the steps of:

providing a device wafer with a first surface layer made of a first material;

providing a handle wafer with a second surface layer made of a second material said second material being different from said first material and no more than one of said two materials is a metal;

joining said first surface to said second surface with a quantity of reactant there between said reactant characterized by chemical reaction with said first material yielding a bonding material differing from both said first material and said second material;

forming a bonded zone of said bonding material which bonds said device and handle wafers together by reaction of said reactant with said first surface layer, wherein:

(a) said first material is silicon;
(b) said second material is an aluminum oxide; and
(c) said reactant includes a nitrate.

2. A method of wafer bonding, comprising the steps of:

providing a device wafer with a first surface layer made of a first material;

providing a handle wafer with a second surface layer made of a second material said second material being different from said first material and no more than one of said two material is a metal;

joining said first surface to said second surface with a quantity of reactant there between said reactant characterized by chemical reaction with said first material yielding a bonding material differing from both said first material and said second material;

forming a bonded zone of said bonding material which bonds said device and handle wafers together by reaction of said reactant with said first surface layer, wherein:

(a) said reactant includes dopants for said first material.

3. A method of wafer bonding, comprising the steps of:

providing a device wafer with a first surface layer made of a first material;

providing a handle wafer with a second surface layer made of a second material said second material being different from said first material and no more than one of said two materials is a metal;

joining said first surface to said second surface with a quantity of reactant there between said reactant characterized by chemical reaction with said first material yielding a bonding material differing from both said first material and said second material;

forming a bonded zone of said bonding material which bonds said device and handle wafers together by reaction of said reactant with said first surface layer, p1 wherein said reaction of said reactant with said first surface layer occurs at a temperature of at most about 500° C.

4. A method of wafer bonding, comprising the steps of:

providing a device wafer with a first surface layer made of a first material;

providing a handle wafer with a second surface layer made of a second material said second material being different from said first material and no more than one of said two material is a metal;

joining said first surface to said second surface with a quantity of reactant there between said reactant characterized by chemical reaction with said first material yielding a bonding material differing from both said first material and said second material;

forming a bonded zone of said bonding material which bonds said device and handle wafers together by reaction of said reactant with said first surface layer, wherein said reactant is a liquid.

5. The method of claim 4 wherein said liquid is an oxidizer.

* * * * *